United States Patent
Modaffari et al.

(10) Patent No.: US 12,101,104 B2
(45) Date of Patent: Sep. 24, 2024

(54) SELF-CALIBRATION CIRCUIT FOR DELTA-SIGMA MODULATORS, CORRESPONDING DEVICE AND METHOD

(71) Applicant: STMICROELECTRONICS S.r.l., Agrate Brianza (IT)

(72) Inventors: Roberto Modaffari, Pallanzeno (IT); Paolo Pesenti, Senago (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 167 days.

(21) Appl. No.: 17/721,110

(22) Filed: Apr. 14, 2022

(65) Prior Publication Data

US 2022/0345150 A1  Oct. 27, 2022

(30) Foreign Application Priority Data

Apr. 22, 2021  (IT) .................... 102021000010280

(51) Int. Cl.
  *H03M 3/00*  (2006.01)
(52) U.S. Cl.
  CPC ........... *H03M 3/384* (2013.01); *H03M 3/422* (2013.01); *H03M 3/436* (2013.01); *H03M 3/464* (2013.01); *H03M 3/496* (2013.01)
(58) Field of Classification Search
  CPC ...... H03M 3/384; H03M 3/422; H03M 3/436; H03M 3/464; H03M 3/496; H03M 3/454; H03M 3/38
  USPC ....................................................... 341/143
  See application file for complete search history.

(56) References Cited

U.S. PATENT DOCUMENTS

| | | | | |
|---|---|---|---|---|
| 5,920,273 | A * | 7/1999 | Hirano | H03M 3/384 341/118 |
| 9,825,645 | B1 * | 11/2017 | Gaggl | H03M 1/0624 |
| 11,245,410 | B1 * | 2/2022 | Dalla Longa | H03M 1/066 |
| 2012/0169521 | A1 * | 7/2012 | da Silva | H03M 3/386 341/120 |

(Continued)

OTHER PUBLICATIONS

Chen et al., "Design of a wideband low-power continuous-time ΣΔ modulator in 90 nm 1 CMOS technology," *Analog Integr Circ Sig Process* 54(3):187-199, Springer, Feb. 2008.

(Continued)

*Primary Examiner* — Jean B Jeanglaude
(74) *Attorney, Agent, or Firm* — Seed IP Law Group LLP

(57) ABSTRACT

A delta-sigma modulator includes a quantizer, a signal propagation path including a plurality of cascaded integrators coupled between the input node and the quantizer, and a feedback network including a plurality of digital-to-analog converters. In a calibration mode of operation, a first digital-to-analog converter of the plurality of digital-to-analog converters of the feedback network receives a signal including a periodic alternated digital sequence, the first digital-to-analog converter being coupled to a first integrator of the plurality of cascaded integrators, integrators of the plurality of cascaded integrators other than the first integrator operate in a gain mode of operation, the delta-sigma modulator generates a digital test signal at an output of the quantizer based on the signal including the periodic alternated digital sequence, and calibration circuitry generates a calibration signal based on the digital test signal and a reference digital word.

27 Claims, 10 Drawing Sheets

(56) References Cited

U.S. PATENT DOCUMENTS

| | | | |
|---|---|---|---|
| 2014/0022102 A1* | 1/2014 | Cho .................. | H03M 3/38 |
| | | | 341/120 |
| 2015/0091745 A1* | 4/2015 | Pagnanelli ........... | H03M 3/468 |
| | | | 341/143 |
| 2019/0097647 A1* | 3/2019 | Imaizumi .............. | H03M 3/34 |

OTHER PUBLICATIONS

Cho et al., "A 6-mW, 70.1-dB SNDR, and 20-MHz BW Continuous-Time Sigma-Delta 2 Modulator Using Low-Noise High-Linearity Feedback Dac," *IEEE Transactions on Very Large Scale Integration (VLSI) Systems* 25(5): 1742-1755, May 2017.

* cited by examiner

SELF-CALIBRATION CIRCUIT FOR DELTA-SIGMA MODULATORS, CORRESPONDING DEVICE AND METHOD

BACKGROUND

Technical Field

The description relates to self-calibration circuits.

One or more embodiments may be applied, for instance, in continuous-time delta-sigma modulators.

Description of the Related Art

Intrinsic anti-alias filter, low noise and reduced power consumption have contributed to the popularity of continuous-time delta-sigma modulators (CTDSM) in the past two decades.

Various design examples have been reported in the literature for a variety of applications, proving the versatility of such high-performance ADCs.

An issue related to CTDSMs may lie in their possible implementation with active-RC integrators, relatively low-performance quantizers and resistive or current-steering digital-to-analog converters (DACs). In fact, RC integrators suffer from process variations and using them almost invariably involves calibration. Calibration can be implemented acting on the feedback capacitance of the integrators, primarily during final test operations which may take time in the order of seconds for each individual device.

Extrapolating the RC time constant from an auxiliary circuit representing a replica of the RC network has been proposed in order to address these issues. Such a circuit may be located far from the modulator loop filter, which makes the whole calibration procedure sensitive to gradients in variables associated with the fabrication of the chip. Also, calibration which is not performed in the loop of the modulator may be inaccurate.

Area issues may also arise: in view of area constraints, the auxiliary circuitry may not represent an accurate replica of the RC network, which adversely affects measurements underlying calibration.

BRIEF SUMMARY

One or more embodiments may relate to a device. A delta-sigma modulator may be exemplary of such a device.

One or more embodiments may relate to a method.

In one or more embodiments, a modulator such as a CTDSM can enter a test mode (as opposed to an operative configuration) which facilitates a direct measurement of the loop filter parameters in providing an effective calibration of the delta-sigma coefficients.

In response to entering the test mode:
the modulator is set to an open-loop mode with all the integrators except the first configured as gain stages and a square waveform which conveys the information involved in trimming is generated in such a condition,
an average value of that waveform is compared with an expected value stored in a set of registers, a trimming value is calculated based on the difference resulting from comparison, and an operative mode (closed loop configuration) is entered once calibration is completed.

In one or more embodiments, circuitry involved in such type of operation includes a digital chain and analog integrators able to be configured as gain stages.

As an advantage, one or more embodiments facilitate achieving improved accuracy and reduced calibration time.

Also, a trimming procedure according to the embodiments can provide a direct measurement of the loop filter parameters taking into account possible variations associated to both coefficients and voltage references.

One or more embodiments facilitate achieving a desired accuracy of the results re-using or re-configuring hardware already present on a modulator chip, with the addition of a simple digital state machine for the implementation of successive approximation register (SAR) search algorithm.

In an embodiment, a device comprises a delta-sigma modulator having: an input node; a quantizer; a signal propagation path including a plurality of cascaded integrators coupled between the input node and the quantizer; and a feedback network including a plurality of digital-to-analog converters. In a quantizing mode of operation, each of the plurality of digital-to-analog converters of the feedback network is coupled between an output of the quantizer and a respective integrator of the plurality of cascaded integrators; and the delta-sigma modulator generates a digital signal at an output of the quantizer based on an analog input signal received at the input node. In a calibration mode of operation, calibration circuitry is coupled to the output of the quantizer. A first digital-to-analog converter of the plurality of digital-to-analog converters of the feedback network receives a signal including a periodic alternated digital sequence, the first digital-to-analog converter being coupled to a first integrator of the plurality of cascaded integrators. Integrators of the plurality of cascaded integrators other than the first integrator operate in a gain mode of operation. The delta-sigma modulator generates a digital test signal at an output of the quantizer based on the signal including the periodic alternated digital sequence, and the calibration circuitry generates an integrator calibration signal based on the digital test signal and a reference digital word.

In an embodiment, a system comprises: a sensor; a delta-sigma modulator coupled to the sensor, the delta-sigma modulator having: a quantizer; a signal propagation path including a plurality of cascaded integrators coupled between the sensor and the quantizer; and a feedback network including a plurality of digital-to-analog converters, wherein in a quantizing mode of operation, each of the plurality of digital-to-analog converters of the feedback network is coupled between an output of the quantizer and a respective integrator of the plurality of cascaded integrators; and the delta-sigma modulator generates a digital signal at an output of the quantizer based on an analog input signal received from the sensor; and calibration circuitry coupled to the output of the quantizer, wherein in a calibration mode of operation, a first digital-to-analog converter of the plurality of digital-to-analog converters of the feedback network receives a signal including a periodic alternated digital sequence, the first digital-to-analog converter being coupled to a first integrator of the plurality of cascaded integrators; integrators of the plurality of cascaded integrators other than the first integrator operate in a gain mode of operation; the delta-sigma modulator generates a digital test signal at an output of the quantizer based on the signal including the periodic alternated digital sequence; and the calibration circuitry generates an integrator calibration signal based on the digital test signal and a reference digital word.

In an embodiment, a method comprises: operating a delta-sigma modulator having calibration circuitry in a calibration mode of operation, generating an integrator calibration signal; calibrating the delta-sigma modulator based on the integrator calibration signal; and operating the calibrated delta-sigma modulator in a quantizing mode of operation, wherein, the delta-sigma modulator includes: an input node; a quantizer; a signal propagation path including a plurality of cascaded integrators coupled between the input node and the quantizer; and a feedback network including a plurality of digital-to-analog converters, in the calibration mode of operation, the calibration circuitry is coupled to the output of the quantizer; a first digital-to-analog converter of the plurality of digital-to-analog converters of the feedback network receives a signal including a periodic alternated digital sequence, the first digital-to-analog converter being coupled to a first integrator of the plurality of cascaded integrators; integrators of the plurality of cascaded integrators other than the first integrator operate in a gain mode of operation; the delta-sigma modulator generates a digital test signal at an output of the quantizer based on the signal including the periodic alternated digital sequence; and the calibration circuitry generates the integrator calibration signal based on the digital test signal and a reference digital word, and in the quantizing mode of operation, each of the plurality of digital-to-analog converters of the feedback network is coupled between an output of the quantizer and a respective integrator of the plurality of cascaded integrators; and the delta-sigma modulator generates a digital signal at an output of the quantizer based on an analog input signal received at the input node.

In an embodiment, a non-transitory computer-readable medium's contents configure a delta-sigma modulator having calibration circuitry to perform a method, the method comprising: operating the delta-sigma modulator in a calibration mode of operation, generating an integrator calibration signal; calibrating the delta-sigma modulator based on the integrator calibration signal; and operating the calibrated delta-sigma modulator in a quantizing mode of operation, wherein, the delta-sigma modulator includes: an input node; a quantizer; a signal propagation path including a plurality of cascaded integrators coupled between the input node and the quantizer; and a feedback network including a plurality of digital-to-analog converters, in the calibration mode of operation, the calibration circuitry is coupled to the output of the quantizer; a first digital-to-analog converter of the plurality of digital-to-analog converters of the feedback network receives a signal including a periodic alternated digital sequence, the first digital-to-analog converter being coupled to a first integrator of the plurality of cascaded integrators; integrators of the plurality of cascaded integrators other than the first integrator operate in a gain mode of operation; the delta-sigma modulator generates a digital test signal at an output of the quantizer based on the signal including the periodic alternated digital sequence; and the calibration circuitry generates the integrator calibration signal based on the digital test signal and a reference digital word, and in the quantizing mode of operation, each of the plurality of digital-to-analog converters of the feedback network is coupled between an output of the quantizer and a respective integrator of the plurality of cascaded integrators; and the delta-sigma modulator generates a digital signal at an output of the quantizer based on an analog input signal received at the input node.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the following description various specific details are given to provide a thorough understanding of various exemplary embodiments of the present specification. The embodiments may be practiced without one or several specific details, or with other methods, components, materials, etc. In other instances, well-known structures, materials, or operations are not shown or described in detail in order to avoid obscuring various aspects of the embodiments. Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings/references provided herein are for convenience only, and therefore do not interpret the extent of protection or scope of the embodiments.

Also, throughout this description:
- like parts or elements will be indicated in the figures with like reference symbols, and a related description will not be repeated for each and every figure,
- a same designation ($V_{IN}$, or $D_{OUT}$, for instance) may be used for simplicity to refer both to a certain signal and to a circuit node/element at which such a signal may be present,
- "adder nodes" will be represented in the form of circuit nodes where two or more signals are added together: as known to those of skill in the art, such nodes can be "with sign," namely nodes where a certain signal is added with one or more other signals with a negative sign, that is subtracted from the combination. Stated otherwise, designating/illustrating a node as an adder node does not imply that the signals added at that node are added with a same sign.

Delta-sigma modulators (DSMs) represent a well-known class of analog-to-digital converters (ADCs) that combine an oversampling approach with a quantization noise shaping technique to achieve high-resolution conversions (16 bit or more) using a relatively simple hardware.

Figure 1:
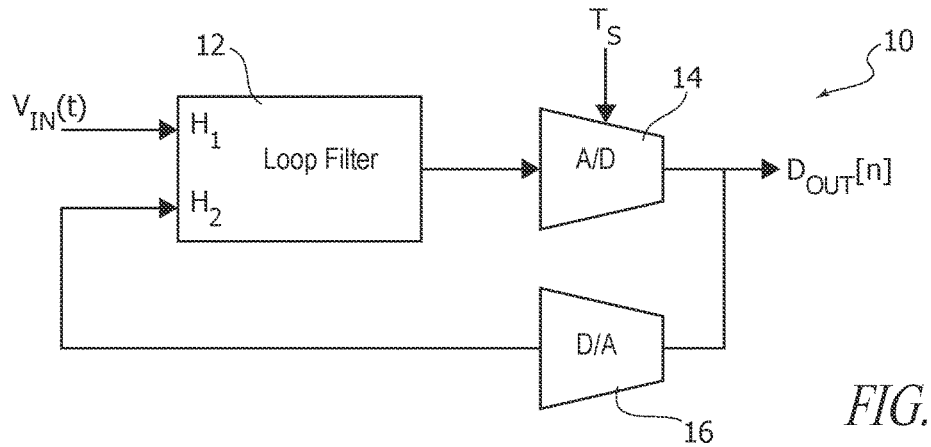
FIG. 1 is a general block diagram of a conventional delta-sigma converter (DSM).

The scheme in FIG. 1 shows a general structure for a delta-sigma modulator (DSM) 10 comprising:
- a loop filter (LF) 12 characterized by two different transfer functions $H_1$ and $H_2$, associated to an input signal path and to a feedback path respectively,
- a quantizer (analog-to-digital or A/D converter) 14 clocked by a clocked signal with a period $T_S$ (generated in manner known per se to those of skill in the art), and
- a feedback digital-to-analog or D/A converter 16.

In general, DSMs may be classed in two types depending on the technique used for the implementation of the loop filter 12.

If the loop filter 12 uses switched-capacitor (SC) circuitry, the modulator is referred to as a Discrete-Time Delta-Sigma Modulator (DTDSM) family.

If the loop filter 12 uses continuous time (CT) circuits, the modulator is referred to as a Continuous-Time Delta-Sigma Modulator (CTDSM).

Both these approaches present pro and cons and, in general, the envisaged context of use determines the option which is adopted for a certain application.

These basic concepts are otherwise well known to those of skill in the art, which makes it unnecessary to provide herein a complete comparison between DTDSMs and CTDSMs.

Figure 2A:
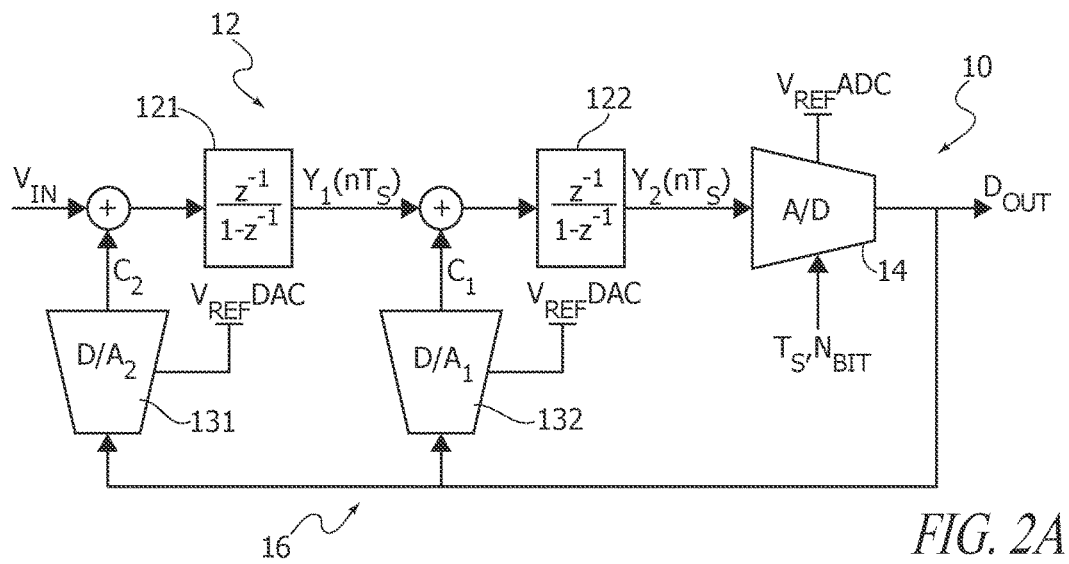
FIG. 2A is a block diagram of an exemplary implementation of a Discrete-Time (DT) converter as illustrated in FIG. 1.
Figure 2B:
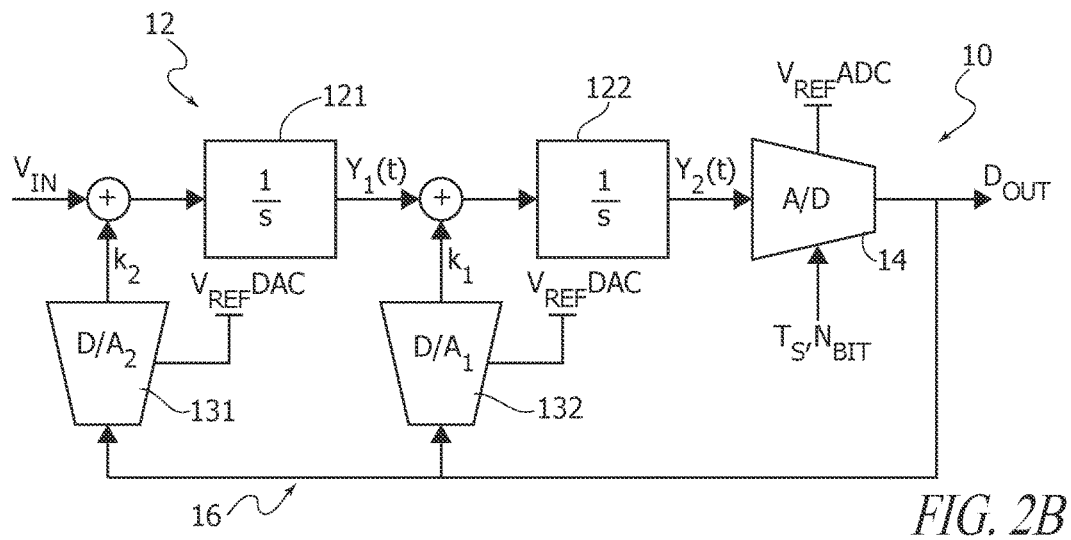
FIG. 2B is a block diagram of an exemplary implementation of a Continuous-Time (CT) converter as illustrated in FIG. 1.

Certain differences which are of interest for the instant description are presented in the block diagrams of FIG. 2A (for a discrete-time loop filter DT-LF) and FIG. 2B (for a continuous-time loop filter CT-LF).

In both figures, a second order modulator is illustrated implemented with a Cascade of Integrator with Feedback (CIFB) topology.

Integrators 121, 122 (two are illustrated for simplicity, but three or more integrators can be provided in certain embodiments) are represented by blocks labeled $z^{-1}/1-z^{-1}$ or 1/s.

A digital-to-analog converter (DAC) feedback network 16 uses a reference voltage $V_{REF}$DAC, while a couple of coefficients $C_1$, $C_2$ (for the switched-capacitor or SC case of FIG. 2A) and $k_1$, $k_2$ (for a continuous-time or CT case of FIG. 2B) represents the feedback coefficients of the loop that define the feedback transfer function $H_2$ (z) or $H_2$ (s).

The coefficients of the input transfer function ($H_1$(z), $H_1$(s)) are assumed to be unitary for simplicity.

The analog-to-digital converter or quantizer 14 works at a sampling frequency $F_S=1/T_S$ which is the same frequency that clocks the loop filter LF in the DT solution) with the reference voltage $V_{REF}$ADC and a number of bits $N_{BIT}$.

Figure 3A:
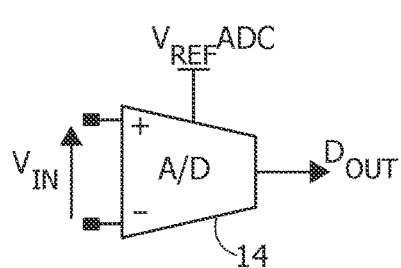
FIG. 3A is a block scheme of an ideal fully differential quantizer.

As shown in FIG. 3A, the analog-to-digital converter or quantizer 14 is entrusted with the conversion of the analog input signal $V_{IN}$ into a digital output code proportional to the ratio $V_{IN}/V_{REF}$ADC.

Figure 3B:
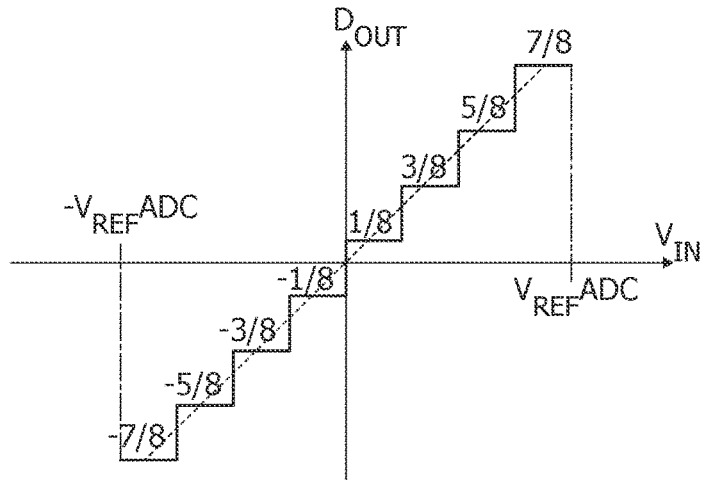
FIG. 3B reproduces the input-output characteristic of a 3-bit ideal quantizer.

For instance, the number of quantization bits may range from 1 to 4 or 5 and in the case of a multi-bit quantizer the associated input-output characteristic may be essentially as reported in FIG. 3B (for the case of 3-bit, fully-differential quantizer). It is noted that the output digital number on the y-axis is expressed in FIG. 3B as a fraction to indicate its relationship with the ratio $V_{IN}/V_{REF}$ADC.

The feedback DAC network 16 performs the conversion of the quantizer digital output into an analog quantity that enables the closure of the modulator loop. This operation is performed adapting the feedback coefficients $C_1$, $C_2$ (for a switched-capacitor or SC case) and $k_1$, $k_2$ (for a continuous-time or CT case) which represent gain terms for the feedback signal whose calculation is based on the implementation of a desired noise transfer function (NTF).

In particular, switched-capacitor or SC modulators use a capacitive feedback DAC arrangement 16 that provides at each sampling period a charge injection into the loop whose value depends on the digital output-code of the converter. Since this charge is usually integrated on the feedback capacitance of an active switched-capacitor or SC integrator, the coefficients $C_1$, $C_2$ are typically defined as a function of capacitive ratios.

In the case of continuous-time or CT modulators, a current-steering DAC or a resistive DAC produce the same code-dependent charge injection, using a current which is distributed on the whole sampling period (for Non-Return-to-Zero or NRZ DACs) or on a fraction of it (for Return-to-Zero or RTZ DACs).

For a continuous-time or CT approach coefficients will be related to parameters such as resistances, capacitances, and sampling frequency.

A voltage $V_{REF}$DAC as illustrated in FIGS. 2A and 2B may represent an (analog) quantity used in the feedback DACs 131, 132 in the feedback network 16 to generate the proper feedback signals.

Depending on the implementation of the DACs 131, 132, ... (as noted, more than two integrators, and thus more than two feedback DACs, may be present) this quantity can be directly sampled in the capacitive DACs in the SC case, or used to generate the current in the feedback resistive DAC for the CT case, or also used in pair with a resistance to generate a current reference $I_{REF}$DAC that provides the bias signal for a current-steering DAC (in the CT case).

Figure 4A:
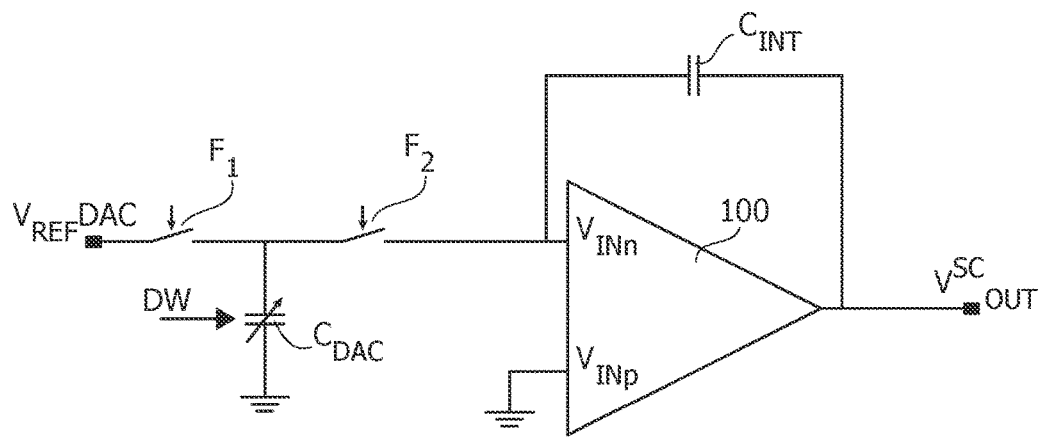
FIG. 4A is a circuit diagram of a single-ended switched-capacitor (SC) integrator.
Figure 4B:
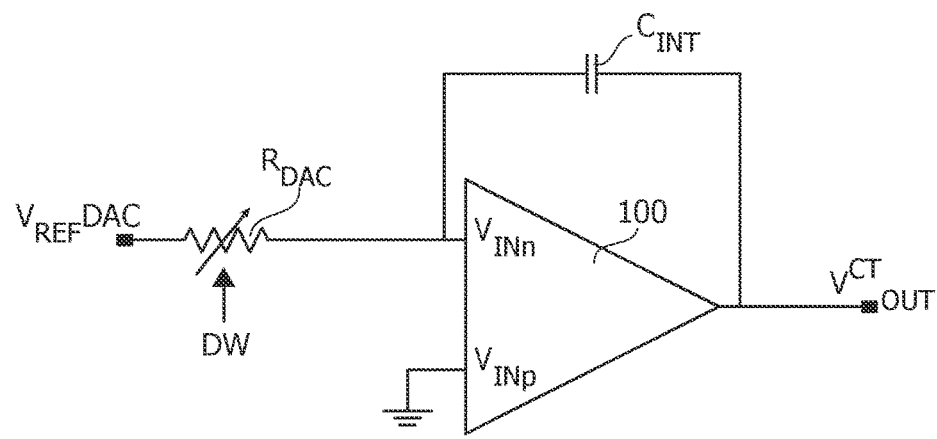
FIG. 4B is a circuit diagram of a single-ended continuous-time (CT) integrator.

This situation, is exemplified in the two circuits of FIGS. 4A and 4B, presented for simplicity in a single-ended version (in both figures, DW denotes the digital word subject to conversion to analog).

FIG. 4A represents a conventional switched-capacitor integrator comprising a "trimmable" capacitance $C_{DAC}$ (which represent the feedback DAC of FIG. 2A) configured to sample the reference voltage $V_{REF}$DAC during a phase $F_1$ (which is the first half of the sampling period) and share the charge $V_{REF}$DAC·$C_{DAC}$ on the virtual ground of an operational transconductance amplifier (OTA) 100 during the phase $F_2$ (which is the second half of the sampling period).

Figure 4C:
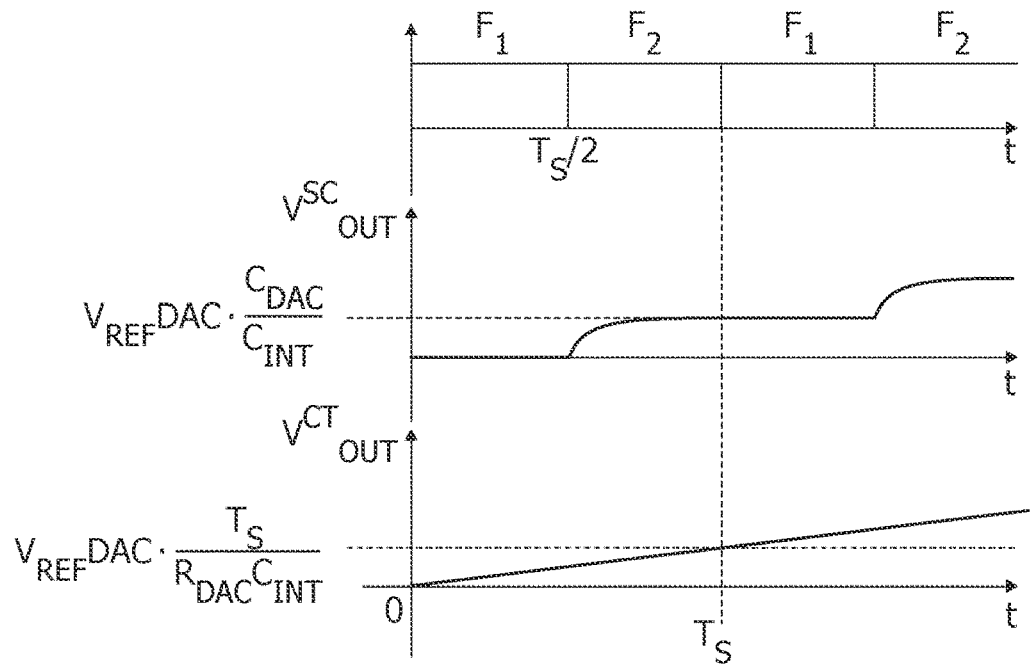
FIG. 4C is a time diagram exemplary of possible time behaviors of signals which may occur in the integrators of FIGS. 4A and 4B.

The output voltage variation of this circuit after one sampling period can be calculated as:

$$V_{OUT}^{SC} = V_{REF}DAC \cdot \frac{C_{DAC}}{C_{INT}} \quad (1)$$

and a possible associated time behavior is shown in the second diagram of FIG. 4C.

The coefficients $C_1$, $C_2$ in the diagram of FIG. 2A can be calculated as:

$$C_1 = \frac{C_{DAC_1}}{C_{INT_1}} \quad (2a)$$

$$C_2 = \frac{C_{DAC_2}}{C_{INT_2}} \quad (2b)$$

where $C_{DAC1}$, $C_{INT1}$, $C_{DAC2}$ and $C_{INT2}$ represent the DAC capacitance and the feedback capacitance of the first integrator and the second integrator, respectively.

FIG. 4B illustrates, in connection with a continuous-time (CT) modulator, architecture called active-RC integrator, which is a commonly used solution for the implementation of analog CT integrators.

In this example a trimmable resistance $R_{DAC}$ represents the feedback DAC of the continuous time circuit in FIG. 2B whose current $V_{REF}$DAC/$R_{DAC}$ produces an output voltage variation over a sampling period that can be calculated as:

$$V_{OUT}^{CT} = V_{REF}DAC \cdot \frac{T_S}{R_{DAC}C_{INT}} \quad (3)$$

A possible associated time behavior is shown in the third diagram of FIG. 4C.

For this solution the coefficients of the corresponding block scheme of FIG. 2B can be determined as:

$$k_1 = \frac{T_S}{R_{DAC_1}C_{INT_1}} \quad (4a)$$

$$k_2 = \frac{T_S}{R_{DAC_2}C_{INT_2}} \quad (4b)$$

where $R_{DAC1}$, $C_{INT1}$, $R_{DAC2}$ and $C_{INT2}$ represent the DAC resistance and the feedback capacitance of the first integrator and the second integrator, respectively.

To sum up, the parameters $V_{REF}$ADC and $V_{REF}$DAC play a similar role in the definition of the feedback transfer function for both the discrete-time or DT (SC) case ($H_2$(z)) and the continuous-time or CT case ($H_2$(s)).

The expression of the coefficients of the integrators 121, 122, . . . is, instead, very different for the two cases: for the switched-capacitor or SC approach Eq. 2 shows that the coefficients depend on a capacitive ratio, which can be considered in most of the cases an accurate process parameter.

Conversely, the continuous-time or CT coefficients described in Eq. 4 show a dependency on parameters such as sampling frequency and RC time constants which usually suffer from process deviations.

This difference between the two architectures may turn out to represent a major drawback in using continuous-time or CT modulators insofar as process deviations are intrinsically involved in a massive industrial production, and the related "spread" effects on the loop coefficients can range from Signal-to-Quantization-Noise Ratio (SQNR) degradation to modulator instability.

A technique proposed to address this situation involves trimming the coefficients in the integrators 121, 122, . . . , which can be performed on the basis of the three parameters of Eq. 4.

It is noted that changing the sampling frequency $F_S$ of the analog-to-digital converter (ADC) 14 to adjust the loop coefficients may be far from easy in various situations and that the resistance term extends over the array of feedback DACs 16.

Figure 5:
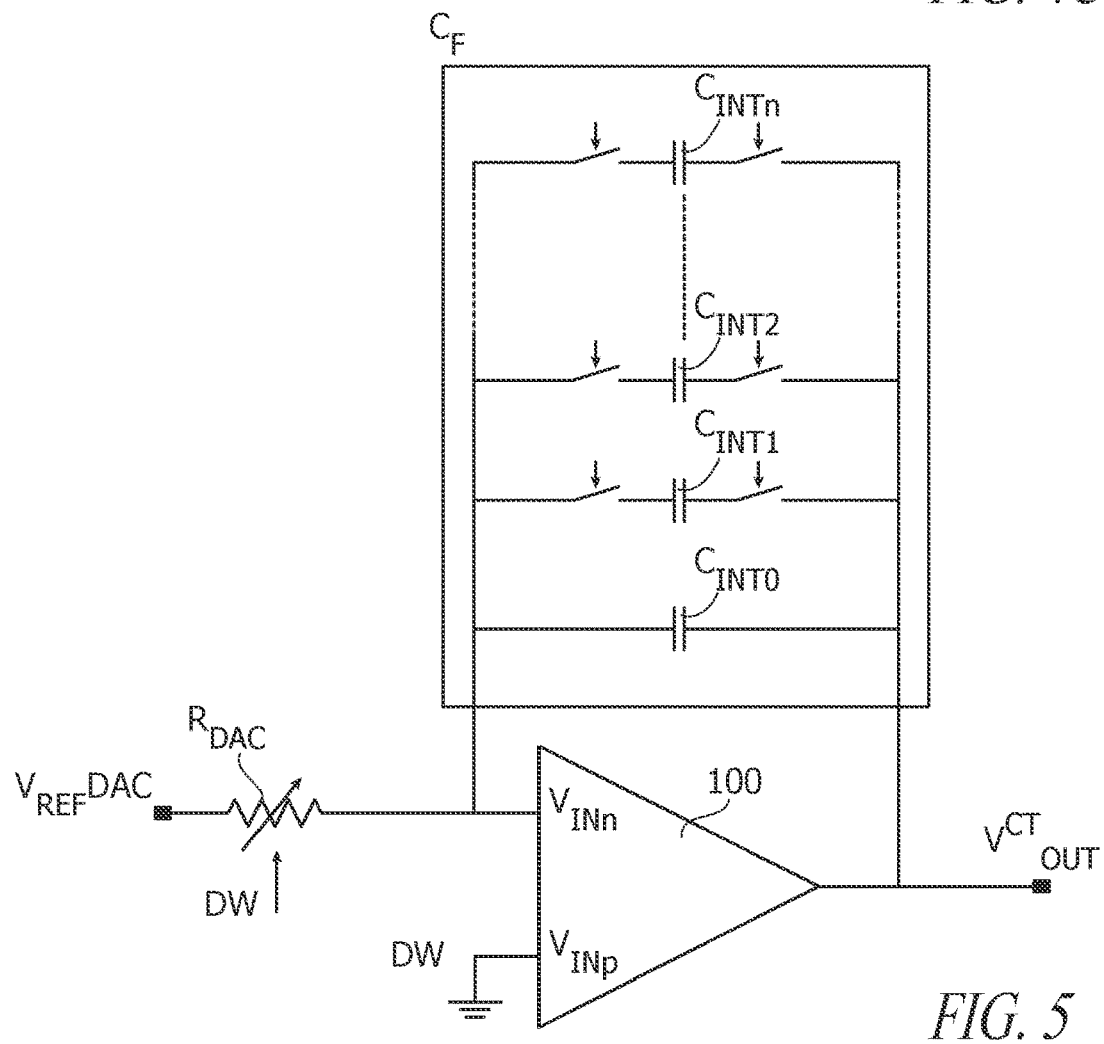
FIG. 5 is a circuit diagram of an active-RC integrator with trimmable feedback capacitance.

A possible solution lies in "splitting" the feedback capacitance of the continuous-time (CT) integrators as a trimmable array of smaller capacitances $C_{INT0}$, $C_{INT1}$, . . . , $C_{INTn}$ as exemplified in FIG. 5.

In this solution, a desired number of capacitances can be connected to the integrator, for instance by providing a proper calibration word to the associated digital register.

It is otherwise noted that, since process deviations are attempted to be (fully) recovered acting only on the capacitive term of the integrator time constant, sizing of the calibration dynamics involves taking into account the maximum process deviation for all the parameters involved in the definition of the noise transfer function (NTF).

An issue related with this possible solution lies in that, in such a calibration procedure, capacitance is trimmed in each device, which involves an accurate measurement of process parameters for every sample.

A dedicated circuitry is thus involved and, in general, an increase in testing time is to be expected.

One or more embodiments may facilitate providing a technique for trimming modulator coefficients in a faster way in comparison with conventional solutions, using simpler circuitry and reaching more accurate calibration results.

An approach proposed for measuring a time constant is to build a monostable circuit whose time interval in the instable condition depends on the RC product.

Figure 6A:
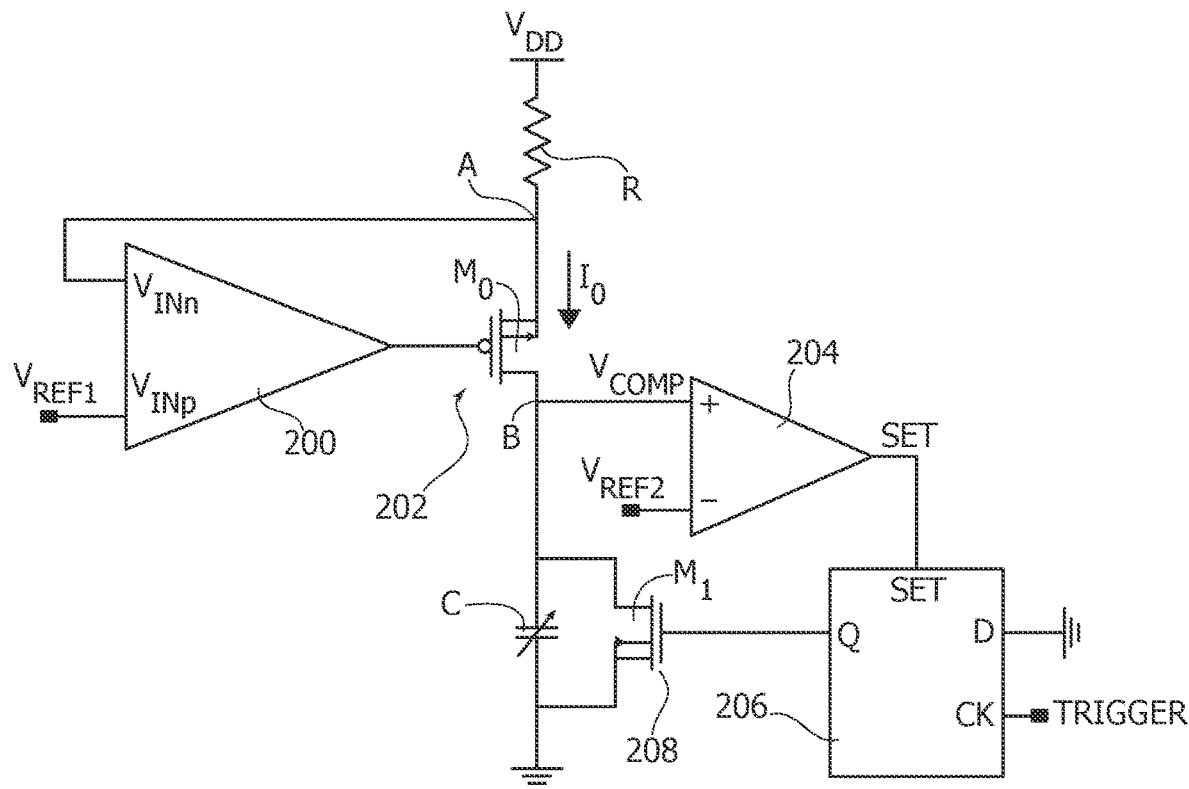
FIG. 6A is a circuit diagram of a monostable circuit adapted for use in RC time-constant measurements.

A possible implementation of such a circuit is shown in FIG. 6A.

In FIG. 6A, reference 200 denotes an operational transconductance amplifier (OTA) 200 having one input coupled to a first reference voltage $V_{REF1}$ and an output which drives a control node (here, the gate) of a MOSFET transistor 202 having the current path therethrough (here, source-drain) coupled at a node A, via a resistor R, to a supply voltage $V_{DD}$.

The voltage at the node A is applied as $V_{INn}$ to the other input of the OTA 200. The current path through the MOSFET transistor 202 is coupled at a node B (with the MOSFET transistor 202 intermediate the nodes A and B) to a (non-inverting) input of comparator 204 to provide thereto a voltage $V_{COMP}$ to be compared with a second reference voltage $V_{REF2}$ and provide a set signal SET to a flip-flop 206 having its D node coupled to ground.

The flip-flop 206 is clocked by a TRIGGER signal and has its Q node coupled to the control node (here, gate) of an electronic switch 208 (a MOSFET transistor, for instance) having the current path therethrough (here, source-drain) arranged in parallel with a capacitor C, the parallel connection of the MOSFET transistor 208 and the capacitor C being arranged intermediate the node B and ground.

Figure 6B:
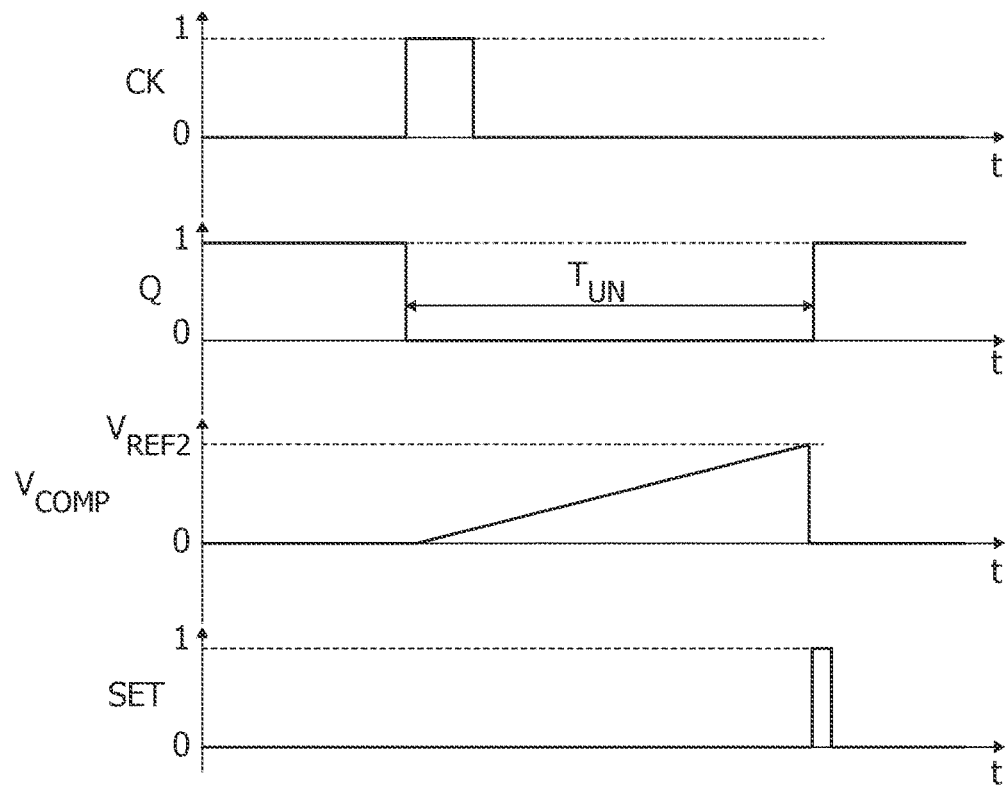
FIG. 6B a timing diagram for the circuit of FIG. 6A.

FIG. 6B is a time diagram exemplary of possible time behaviours, against a common time (abscissa) scale, of signals which may occur in the circuit of FIG. 6A.

Assuming the circuit is in a stable condition, the output of the flip-flop (FF) 206 is $V_{DD}$ and the capacitance C is discharged (the current $I_0=(V_{DD}-V_{REF1})/R$ flows in the switch 208 that shorts to ground the node B ($V_{COMP}$).

Thus, the output of the comparator SET is in logic state 0. When a trigger rising edge is presented on the CK input terminal of the flip flop 206, its output drops to 0 and the voltage of node B ($V_{COMP}$) starts to grow with a linear law, e.g.:

$$V_{COMP} = \frac{t_0}{C} \cdot t = \frac{V_{DD} - V_{REF_1}}{RC} \cdot t \quad (3)$$

Once the $V_{COMP}$ potential at node B reaches the value $V_{REF2}$, the output from the comparator 204 switches its logic state from 0 to 1 setting the flip flop with $Q=V_{DD}$ and discharging the capacitance C.

Thus, the time interval in the unstable condition can be calculated as:

$$T_{UN} = RC \cdot \frac{V_{REF_2}}{V_{DD\_}V_{REF_1}} \quad (4)$$

Knowing the value of $V_{DD}$, $V_{REF1}$ and $V_{REF2}$, and measuring the length of the time interval where the flip flop output is 0, it is possible to know the time constant RC associated to the particular process "corner" of the chip.

This information, together with the measurement of the local clock signal, facilitates finding a calibration value for every tested samples adapted to facilitate restoring the ideal modulator coefficients of Eq. 4.

The search for an optimum calibration can be performed performing a dichotomic search.

Despite its apparent effectiveness, this technique is not exempt from various drawbacks.

In the first place, measuring of the time interval and performing an associated dichotomic search involves using test equipment: the related procedure is intrinsically slow since the monostable signal must be extracted from the chip and interfaced with the test equipment.

A trimming procedure as discussed in the foregoing is unable to cover errors on the feedback transfer function that arise from $V_{REF}$ADC and $V_{REF}$DAC.

Indeed, the situation for the $V_{REF}$DAC signal is relatively easy to manage since the main errors are the offset in the dedicated buffer and the residual calibration error of the on-chip bandgap reference.

The situation can be worse for the parameter $V_{REF}$ADC: for instance, in a modulator where the quantizer 14 is realized using a flash converter, the error on the reference voltage may be similar to those cited for the $V_{REF}$DAC signal.

In case of a high number of bits (5 or 6) a flash converter does not represent an efficient option and more complex architecture such as a successive-approximation ADC converter (briefly SAR) may be considered.

In that case, the desired SAR performance is related (limited) to the one specified for the quantizer. Also, simple SAR architecture will be expectedly involved, with a minimum number of DAC capacitances (typically based on DAC top sampling) together with a capacitive module with a very low capacitance (typically in the range of fF).

Under these conditions, the parasitic capacitances of the DAC and the gate capacitance of the comparator may end up by having a significant role in the definition of the least significant bits (LSB) in the SAR, thus in the definition of the equivalent $V_{REF}$ADC voltage reference, which can be suffer from non-idealities.

As a result, adequate trimming of the modulator coefficients may involve taking into account the LSB error associated with process variations of the parasitic capacitances.

Additionally, a trimming procedure as discussed in the foregoing is not based on the direct measurement of the modulator parameters: it involves extrapolating the RC time constant from an auxiliary circuit which—as already discussed in the introductory portion to this description—can be at a remote location from the modulator loop filter. This makes the whole calibration procedure sensitive to virtually all process gradients associated to the fabrication of the chip.

Furthermore, for medium-frequency applications ($F_S$~100 kHz÷1 MHz), such as in the field of MEMS sensors, where a low power consumption is particularly desirable, typical values for feedback DAC resistances are in the range of tens of MΩ, while integrator capacitances are in the order of tens of pF. These orders of magnitude make it impractical to create a replica of the RC network used in the integrators within the monostable circuit, in so far as the cost in terms of semiconductor area is in most instances unacceptable. This suggests resorting to an even smaller replica, which may result in a further possible source of mismatch between the parameters measured and those used for calibration.

In one or more embodiments, these issues can be addressed providing fully-on-chip self-calibration of the modulator coefficients which can exploit the hardware of the converter for direct measurement of the loop filter coefficients deviation, with the capability of taking into account possible errors related the spread of the $V_{REF}$ADC and $V_{REF}$DAC voltage references.

Figure 7:
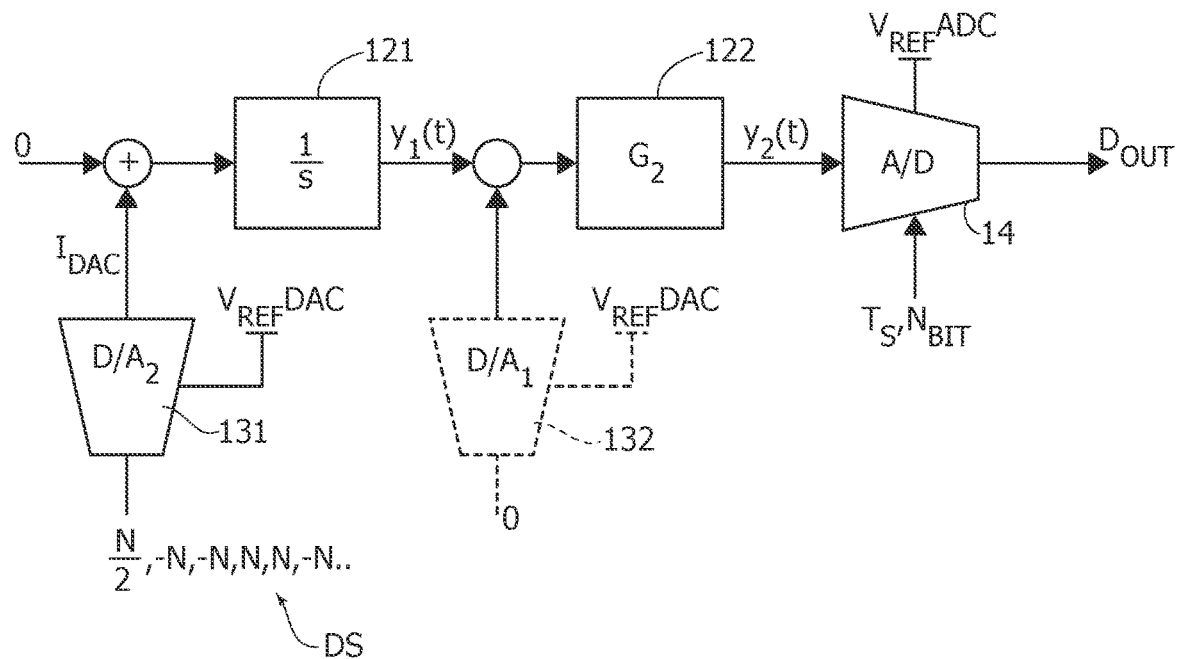
FIG. 7 is exemplary of a test mode configuration for the circuit (modulator) of FIG. 2B.

One or more embodiments may involve configuring a CTDSM essentially as illustrated in FIG. 2B in a test-mode along the lines illustrated in FIG. 7.

To that effect, the modulator of FIG. 2B as illustrated in FIG. 7 can be regarded as having the input of the DAC (D/A$_1$) 132 associated with the second integrator 122 nulled (so-to-say "opening" the feedback from the output of the quantizer 14) and forcing on the input of the DAC (D/A$_2$) 131 associated with the first integrator 121 a periodic digital sequence DS, for example, with period 4 $T_S$ and pattern −N, −N, +N, +N, which starts after a first single sample of value N/2 (where N is a defined digital code whose choice will be discussed later and is comprised between 0 and $2^{N_{Bit}-1}-1$).

The digital sequence DS can be generated in any manner known to those of skill in the art via a generator which is not shown for simplicity.

Figure 8:
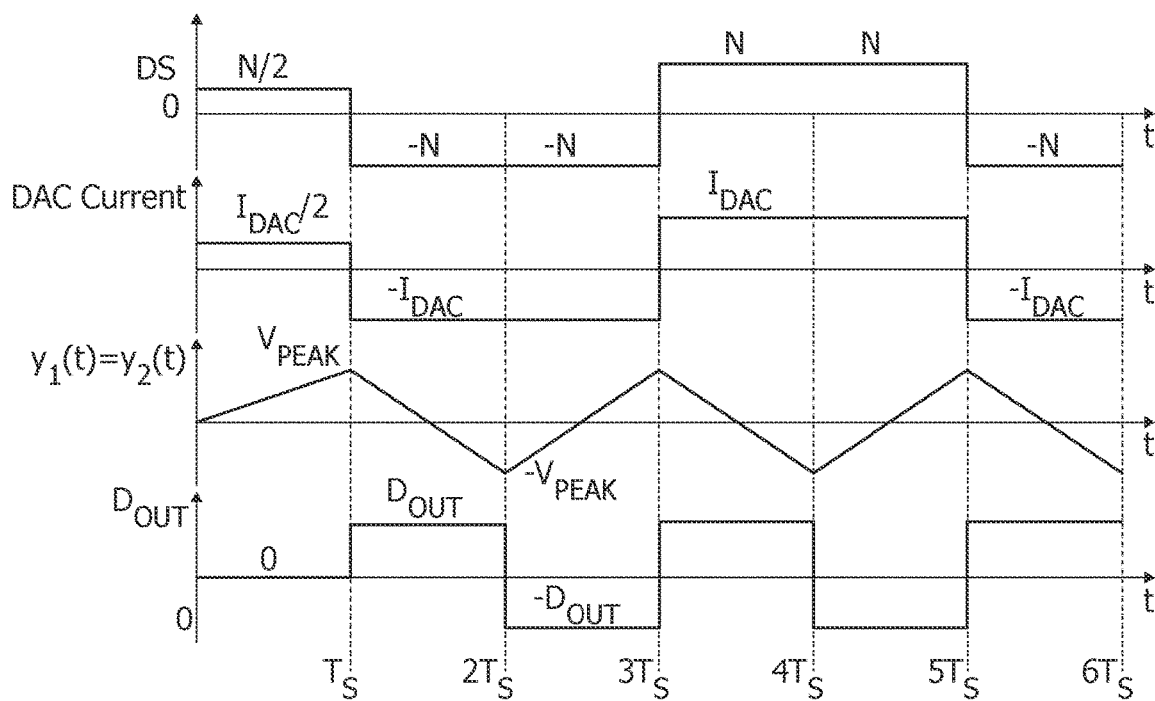
FIG. 8 is a timing diagram for the test-mode circuit of FIG. 7.

The related waveform is reported on the top of the timing diagram in FIG. 8.

In general, for an $N_{BIT}$, fully differential resistive DAC (with $2^{N_{Bit}-1}-1$ positive levels and $2^{N_{Bit}-1}-1$ negative levels) with a DAC element with value $R_{UNIT}$, the current injected in the integrator 121 is:

$$I_{DAC} = N \cdot \frac{V_{REF}DAC}{R_{UNIT}} \quad (5)$$

with N ranging from 0 to $2^{NB_{BIT}-1}-1$.

This current is integrated on the feedback capacitance of the first integrator $C_{INT_1}$ generating on the node $y_1(t)$ a triangular waveform also reported in FIG. 8 whose peak value is:

$$V_{PEAK} = \frac{I_{DAC}}{C_{INT_1}} \cdot T_S = N \cdot \frac{V_{REF}DAC}{R_{UNIT}C_{INT_1}} \cdot T_S \quad (6)$$

From this waveform one may choose to begin the input sequence of the feedback DAC with the value N/2 rather than N, while Eq. 6 define some guidelines for the choice of the parameter N: high enough to generate an non-negligible signal $y_1(t)$ at the output of the first integrator 121 but small enough to avoid the saturation of the stage in every possible process realization.

The feedback DAC 122 (D/A$_1$) associated with the second integrator 122 (and all the other DACs in case of modulators with order ≥3) is thus disabled and thus disconnected from the loop filter imposing its input value to 0, while the second integrator 122 (and all the other integrators in case of modulators with order ≥3) are re-configured as gain stages (a unitary gain can be assumed in this example for simplicity).

There are different ways of performing this operation.

Figure 9:
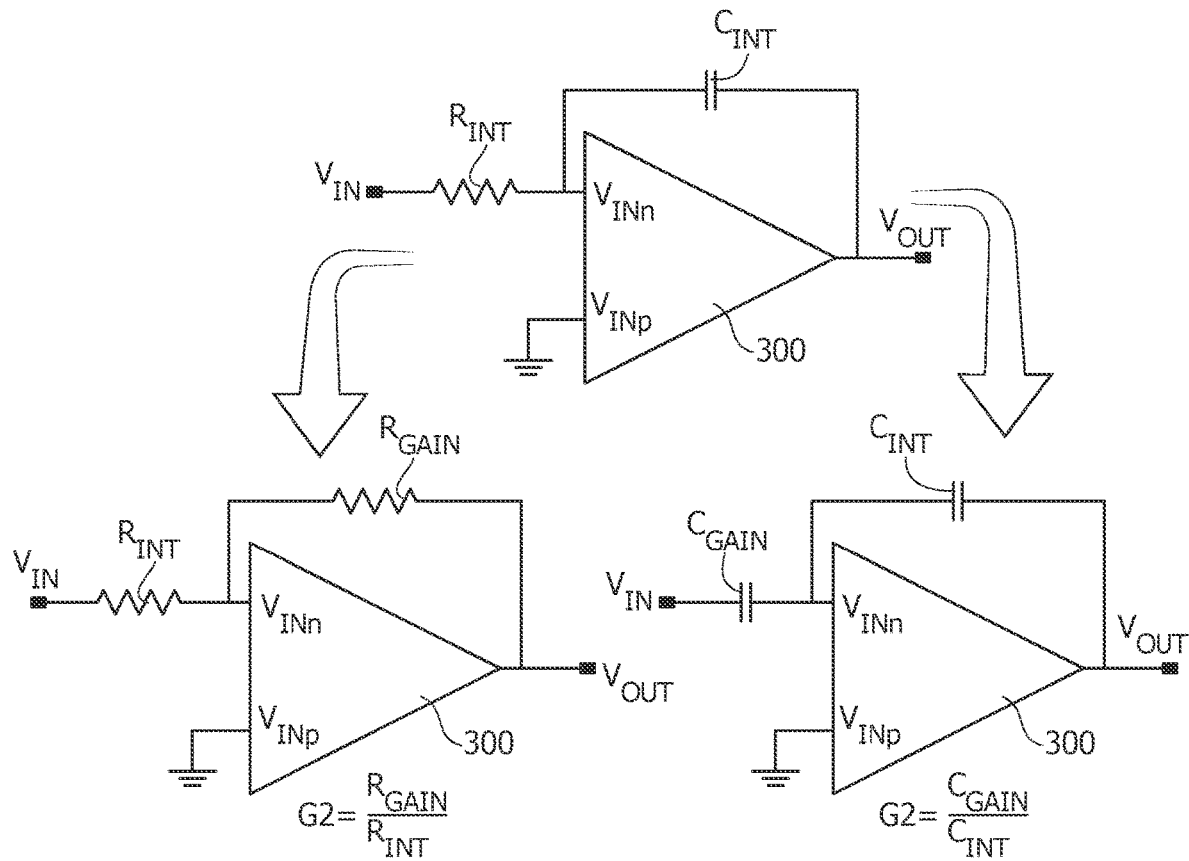
FIG. 9 is exemplary of various example modes of converting an integrator into a gain stage.

This is shown in FIG. 9, where the possibility is shown of converting into a gain stage with gain G2 a CT integrator built around an operational transconductance amplifier (OTA) 300—shown at the top of the figure, for example, —either by:

replacing the feedback capacitance $C_{INT}$ with a resistance $R_{GAIN}$—in a first case (bottom left in the figure), or replacing the input resistance $R_{INT}$ with a capacitance $C_{GAIN}$—in a second case (bottom right in the figure).

While not illustrated in the figures for simplicity, any of the integrators in a CTDSM as exemplified in FIG. 2B (for instance, the integrator 122 in the exemplary case considered herein) lends itself to being made convertible to a gain stage in test mode operation by including therein:

- a feedback resistance $R_{GAIN}$ having associated switch circuitry configured to connect—during test mode operation—the resistance $R_{GAIN}$ in the place of the feedback capacitance $C_{INT}$, or,
- an input capacitance $C_{GAIN}$ having associated switch circuitry configured to connect—during test mode operation—the capacitance $C_{GAIN}$ in the place of the input resistance $R_{INT}$.

The disconnection of the feedback path through the converter 132 (D/A$_1$) and replacing the second integrator 122 with a (e.g., unitary) gain stage with gain G$_2$ causes the output of the first integrator, $y_1(t)$, to be carried unaltered to the input of the quantizer 14.

The consequent analog-to-digital conversion generates a sequence of digital pulses for $D_{OUT}$ with alternate sign as shown in FIG. 8.

The amplitude of each samples can be calculated as:

$$D_{OUT} = \text{round}\left(\frac{V_{PEAK}}{V_{REF}ADC} \cdot 2^{N_{BIT}-1}\right) \quad (7)$$

$$\text{round}\left(N \cdot \frac{T_S}{R_{UNIT}C_{INT_1}} \cdot \frac{V_{REF}DAC}{V_{REF}ADC} \cdot 2^{N_{BIT}-1}\right)$$

where the "round" operation represents the quantization operated by the quantizer.

It is noted that this expression takes into account (all) the variables involved in the definition of the feedback transfer function (for an integrator circuit).

Those samples thus collect the information involved in adequate calibration of the modulator coefficients.

Notionally, a calibration procedure based on some search algorithm can be developed using the data produced in this test mode.

An "ideal" value of each output sample, in fact, can be calculated starting from the ideal value of each parameter that appear in Eq. 7, or simulated in a typical condition with some SPICE (Simulation Program with Integrated Circuit Emphasis) simulator.

The deviation of the measured sequence from the one calculated or simulated returns the correction which can be applied to the loop coefficients to recover the spread of the parameters and fit a desired noise transfer function (NTF).

In-depth analysis shows otherwise that a simple measurement as discussed herein may not be completely satisfactory for various calibration procedures.

For instance, the output sequence in its raw form may be affected by offset of the analog stages, which may produce a degradation of the accuracy of the measurement.

Furthermore, the information is encoded using the quantization levels of the quantizer 14, and thus the sensitivity of the measurement may be outweighed by a low resolution of the circuit.

Addressing these two aspects facilitates providing satisfactory results for—virtually any—generic calibration procedure.

The situation can be investigated considering at first the sole effect of the offset of the second integrator 122 (which is converted into a gain stage with gain G2 during the proposed test mode in FIG. 7).

It is noted that the conclusions reported here for the offset in the stages apply to all the integrators (as noted, more than two integrators may be included in the loop filter 12) except the first (that is, the integrator 121) and for the offset of the quantizer 14.

Figure 10:
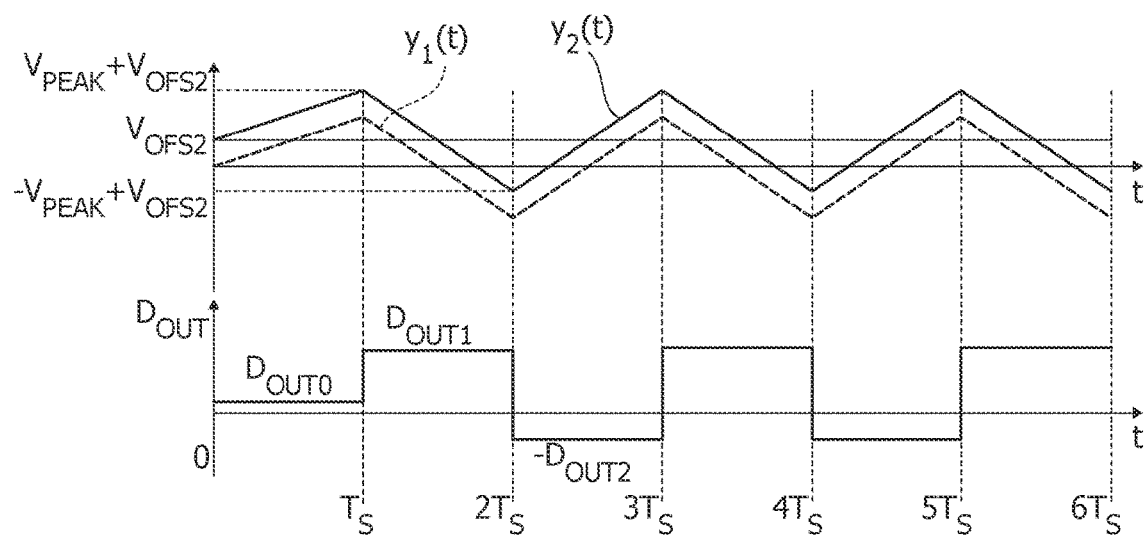
FIG. 10 is a time diagram exemplary of possible time behaviors of signals which may occur in the circuit of FIG. 7.

For the offset of the second integrator 122 one can assume (for simplicity and ease of understanding) a unitary gain and an offset input-referred source that called $V_{OFS2}$. This offset produces a shift of the signal $y_2(t)$ as shown in FIG. 10 and this shift results is an asymmetric output of the quantizer as shown in the same figure.

Neglecting the first sample, the generated digital sequence presents two different values which can be calculated as:

$$D_{OUT1} = \text{round}\left(\frac{V_{PEAK} + V_{OFS2}}{V_{REF}ADC} \cdot 2^{N_{BIT}-1}\right) \quad (8a)$$

$$D_{OUT2} = \text{round}\left(\frac{V_{PEAK} - V_{OFS2}}{V_{REF}ADC} \cdot 2^{N_{BIT}-1}\right) \quad (8b)$$

Advantageously, these two values can be used to implement an offset cancellation in so far as the offset is present with opposite signs in the two samples.

Thus, an ideal moving average operation of the form:

$$D_{AVG} = \frac{D_{OUT1} + D_{OUT2}}{2} \quad (9)$$

will result in a sequence $D_{AVG}$ free from any offset contributor.

Figure 11:
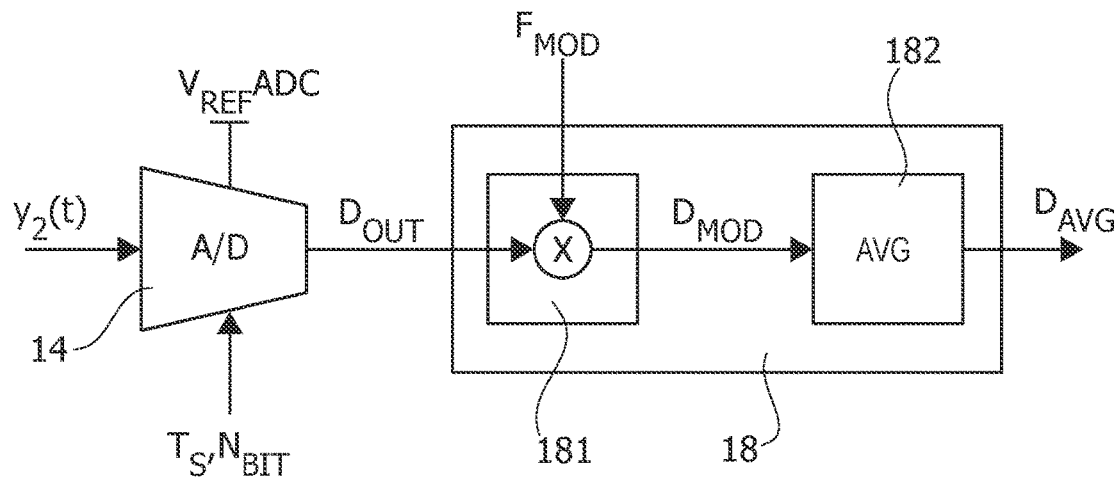
FIG. 11 is a block diagram of an exemplary implementation of a digital signal processor (DSP) chain for offset cancellation.

FIG. 11 illustrates a simple way of implementing this operation in a DSP chain 18 modulating at 181 the signal $D_{OUT}$ from the quantizer 14 with a signal $F_{MOD}$ (a square-wave of period $2 T_S$ generated in any manner known to those of skill in the art for that purpose, e.g., via a square wave generator not shown for simplicity) and applying to the modulated signal $D_{MOD}$ a moving average filter 182.

Figure 12:
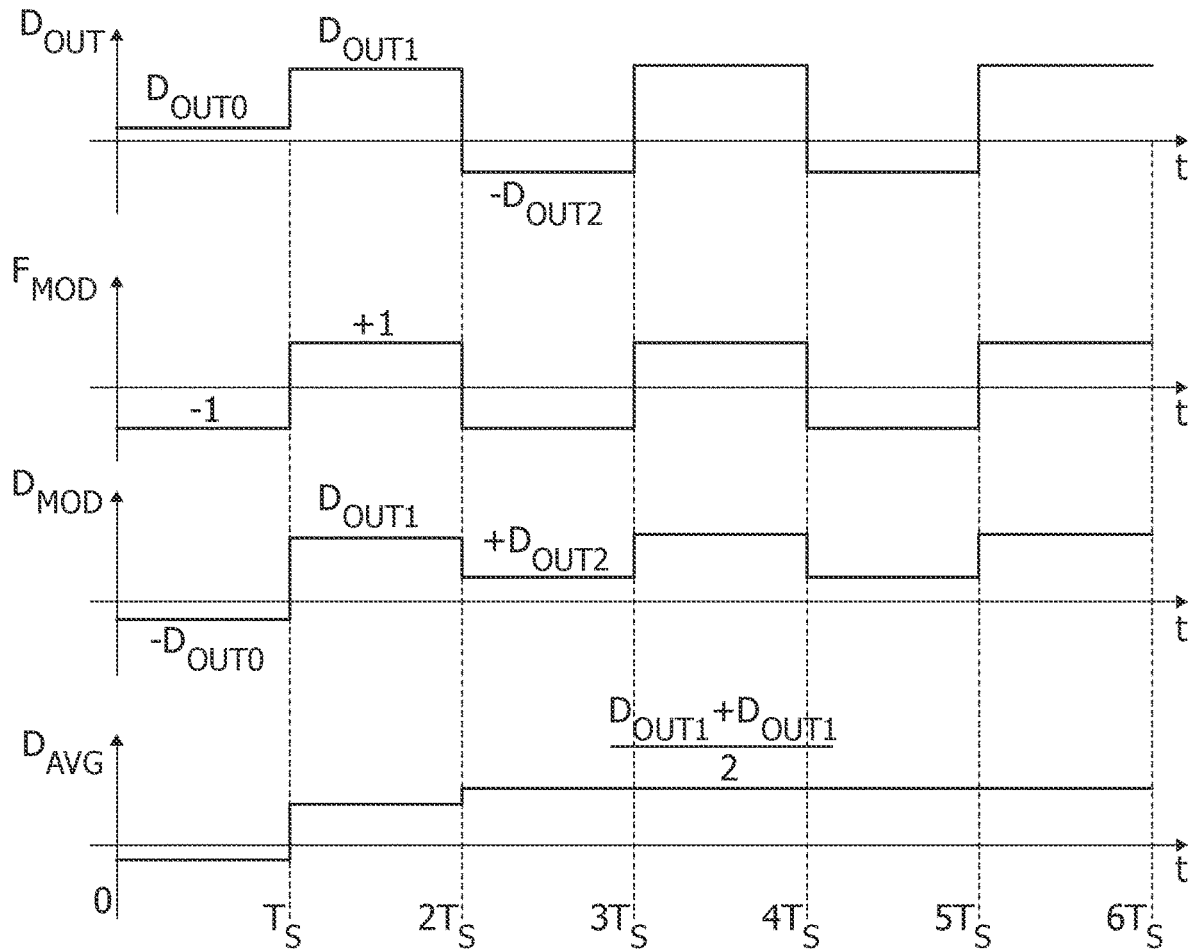
FIG. 12 is a time diagram exemplary of possible time behaviors of signals which may occur in DSP circuitry as illustrated in FIG. 11.

In this (ideal) case the moving average in the filter 182 will be able to produce an output signal $D_{AVG}$ free from any offset contributor (see FIG. 12).

The "round" operation of Eq. 8 associated with the quantization process plays a role in system performance because, at the input of the quantizer 14, the desired useful information is mixed with offset in a signal which cannot be resolved by a low-resolution quantizer with a desired accuracy.

This may adversely affect the offset cancellation procedure and, more generally, the accuracy of the whole test mode accuracy.

The resolution of architecture as discussed herein can be improved by applying dithering to the quantizer 14.

Figure 13:
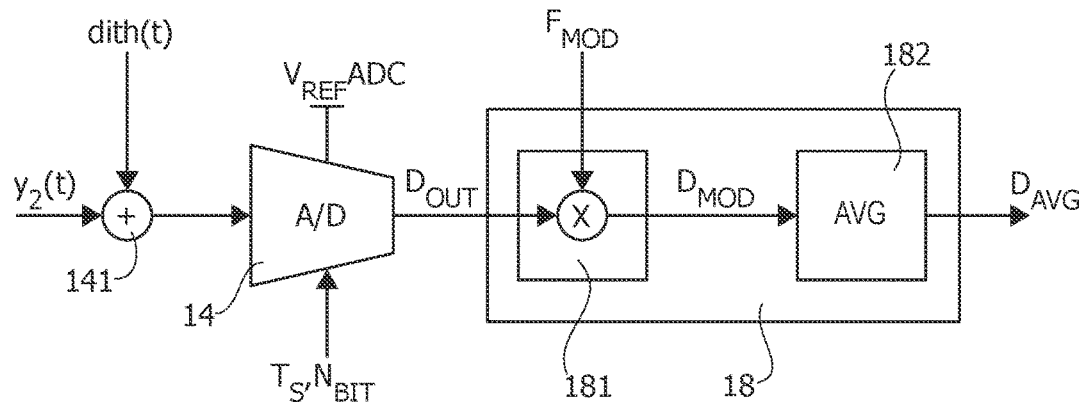
FIG. 13 is illustrative of the possible introduction of dithering to increase system resolution in the digital signal processor circuitry of FIG. 11.

As shown in FIG. 13, a source 141 of dither dith(t) of the modulator is kept turned on during the test mode: this source is currently already available as a design feature in the kind of converter discussed herein, which makes it unnecessary to provide a specific additional description.

The dither dith(t) (having an amplitude which may advantageously be half LSB) causes the output of the quantizer 14 to switch between adjacent codes also in the case of a static input signal: this situation is likely to occur when the thermal noise contributor alone is not able to produce any output variation.

The resulting signal variability facilitates increasing the system resolution applying a digital filtering that cuts the noise bandwidth: the moving average introduced for the offset cancelation represents also in this case a possible filtering strategy.

In this situation, the number of averages can be selected to be higher than two since this number defines the final accuracy of the signal $D_{AVG}$ output from the filter 182 (as specified as a function of the resolution used for the calibration of the integrators coefficients shown in FIG. 5).

In general, a resolution gain of half LSB can be expected for each doubling of the averages number as a general law.

If desired, a more complex digital input pattern can be introduced to increase the variability of the analog signal. It is noted that the digital filter can be implemented by a dedicated reconfiguration of the decimator filter used in the Digital Signal Processing (DSP) chain that is typically associated to this kind of Analog-to-Digital converters.

Adopting this approach, the increase in resolution is achieved to the detriment of system bandwidth, and the desired signal will lie in the lower portion of the spectrum.

From this point of view, the block 181 that performs the modulation of the output from the quantizer 14 may play a significant role, in so far as its effect is the baseband conversion of the desired signal and the modulation of the offset at the half of the sampling frequency: in this position, the offset tone will be canceled by the zeros associated to the mobile average transfer function (which is advantageously chosen with an even number of averages).

A further non-ideality to be dealt with in a circuit as discussed herein is the offset of the first integrator.

In an approach as discussed herein, this stage is not converted into a simple amplifier (gain stage) like the other integrators, but retains its original function. In the test-mode, this integrator works in open-loop and its input offset, if not managed, may lead to undesired saturation of the stage.

Figure 14:
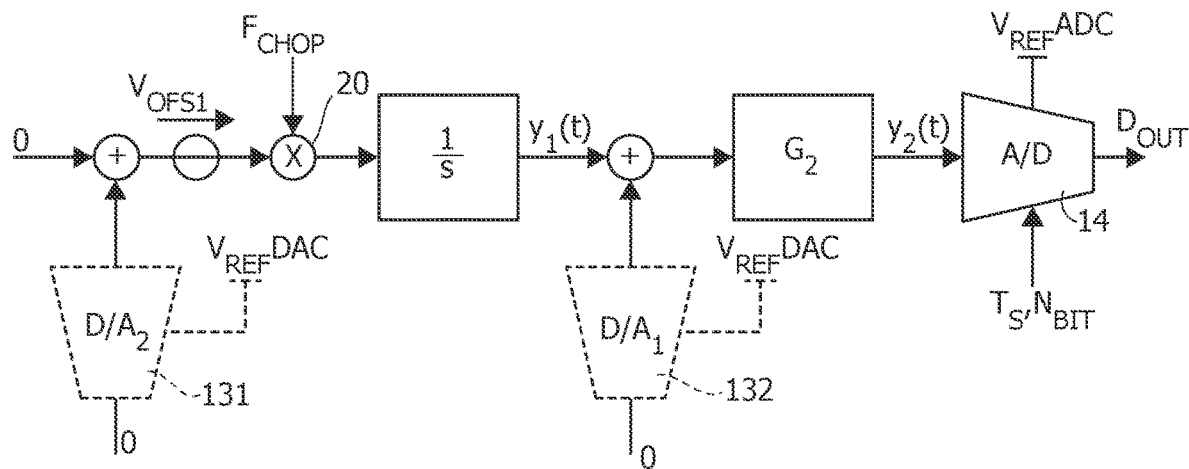
FIG. 14 is a block diagram of a delta-sigma modulator configured in an open-loop condition highlighting first integrator offset and related chopping.

This effect can be effectively countered introducing a chopping in the operational amplifier of the first integrator as schematically represented at 20 in FIG. 14.

This stage defines noise and offset performance of the whole converter, and chopping is usually already provided as a design feature, with no extra hardware required (and no detailed description required for this known feature).

Figure 15:
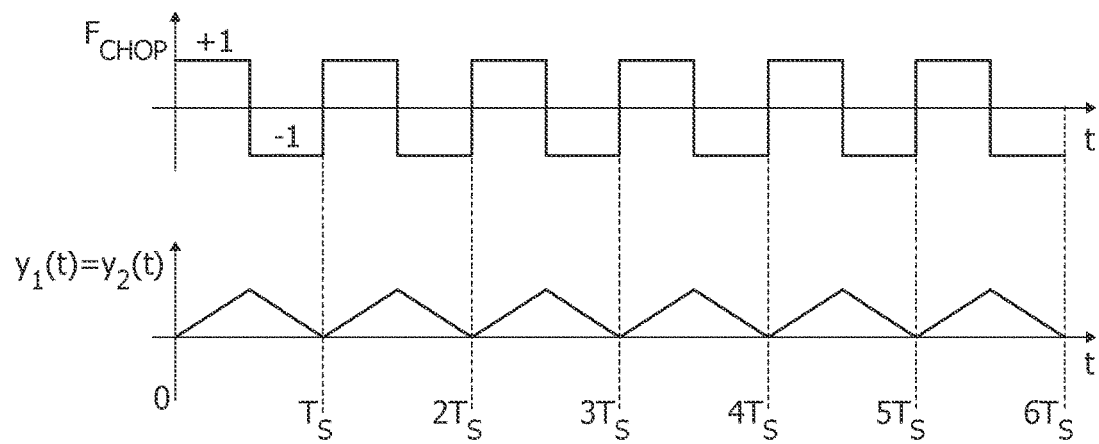
FIG. 15 is a time diagram exemplary of possible time behaviors of signals which may occur in the circuit of FIG. 14.

The effect of the chopper 20 on the first integrator offset (named $V_{OFS1}$ in FIG. 14) is shown in FIG. 15, where for simplicity, the signal from the DAC $D/A_2$ has been nulled.

The signal $F_{CHOP}$ is a square wave with null mean (zero average) with a frequency which can be chosen—by way of example—equal to $F_S$.

As shown in FIG. 15, the choice of this chopping frequency produces on the output a null signal at every sampling instant so that the undesired non-ideality is (completely) cancelled by quantization.

A test-mode approach as discussed herein facilitates achieving an accurate digital representation of the process variations that affect a delta-sigma modulator.

This information is enclosed in the signal $D_{AVG}$ and can be used to implement a proper coefficient calibration.

Depending on the desired accuracy, a simple one-shot calibration or more complex searching algorithm can be provided.

Figure 16:
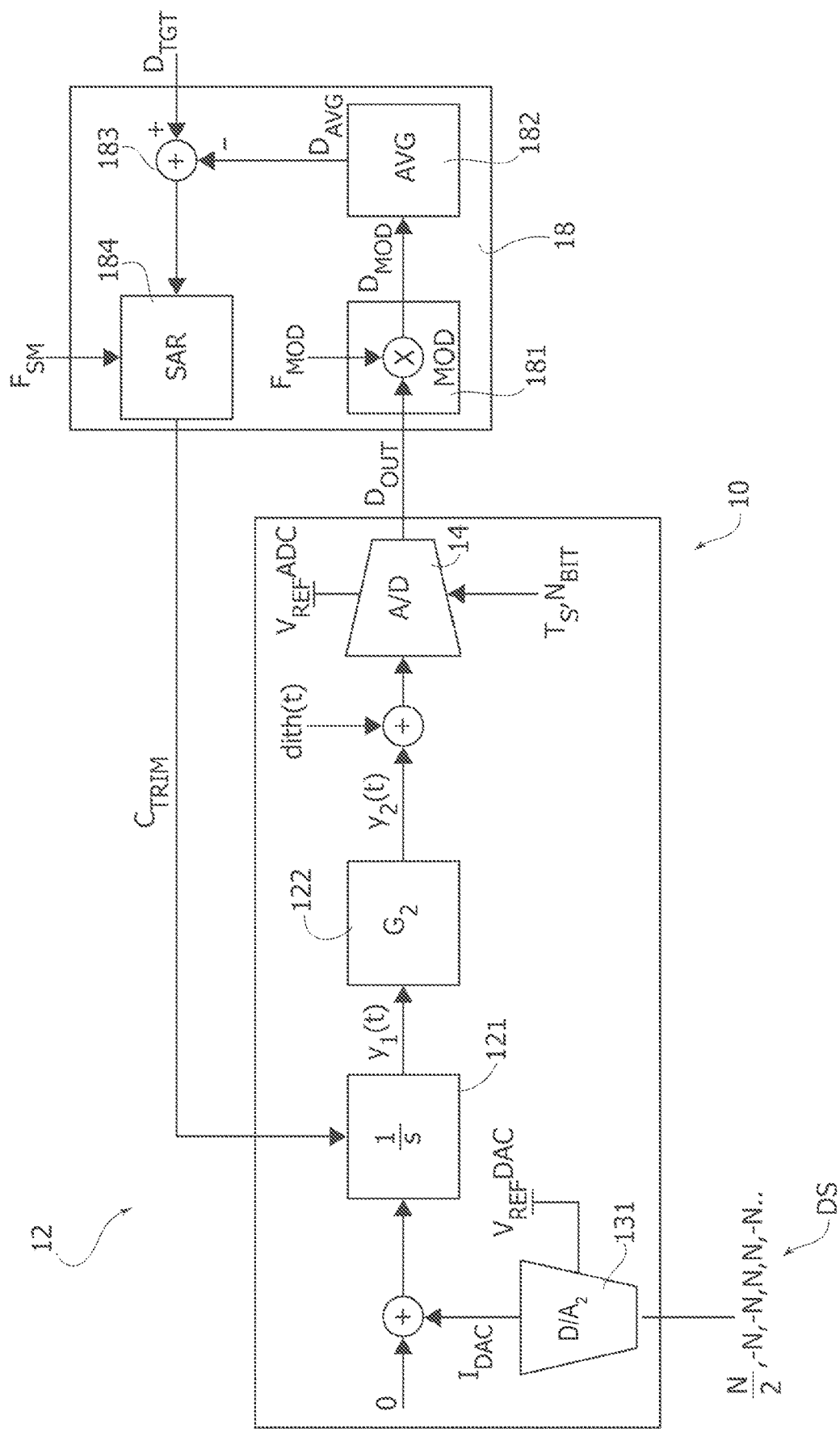
FIG. 16 is exemplary of a test mode configuration for a circuit (modulator) in a successive approximation register (SAR) architecture which may be used within the framework of embodiments of the present description.

FIG. 16 is exemplary of "fully on-chip" calibration, where the DSP circuitry 18 is configured to receive a target digital word $D_{TGT}$ (calculated/extracted, from SPICE simulation, for instance), provided via a dedicated digital register, for instance. As illustrated in FIG. 16, the DSP circuitry 18 can be configured to compare a target digital word $D_{TGT}$ with the output $D_{AVG}$ of the modulator (brought to a test mode) in a comparison node 183 (here exemplified as an adder—with sign).

As a function of the comparison result, a dedicated state machine 184 (using a SAR algorithm, for instance) in the DSP circuitry may control the variable $C_{TRIM}$ that changes the number of feedback capacitances of the first integrator.

This trimming action can be performed in a variety of different ways known to those of skill in the art (e.g., using the technique illustrated in connection with FIG. 5).

It is otherwise noted that one or more embodiments do not specifically concern how such a trimming action can be performed (in a manner known per se).

One or more embodiments are primarily related with producing in a reliable and simple manner a variable such as $C_{TRIM}$. One or more embodiments may thus be largely "transparent" with respect to the specific solution which may be adopted for implementing the trimming action as a function of a variable such as $C_{TRIM}$.

For instance, this operation can be repeated a number of times that depends on the number of bits of the control word $C_{TRIM}$, while the working frequency of the state machine $F_{SM}$ takes into account the settling time of the moving average filter 182 used in the DSP chain 18.

For instance, when the search is completed the modulator can be set to its standard closed-loop configuration and the digital word DW is provided to (all) the trimmable integrators of the loop filter 12—as well as to an on-chip (ROM, for instance) for writing in the circuit/device.

As noted, while implementations with two integrators 121, 122 and two feedback ADCs 131, 132 have been discussed for simplicity, one or more embodiments may comprise more than two (n≥2) integrators with associated feedback DACs.

In that case, during the test mode, the first integrator 121 will again be driven as discussed in the foregoing, while all the other integrators will be reconfigured as gain stages with the associated feedback DACs "nulled" (that is, with the respective feedback paths "opened") as is the case of the integrator 122 and the DAC 132 in the exemplary two-integrator case discussed herein by way of example.

Briefly, the circuit 10 illustrated herein comprises an input node $V_{IN}$ configured to receive an analog input signal, and a quantizer circuit (A/D) 14 having an output node $D_{OUT}$.

The quantizer circuit is operable to provide at the output node $D_{OUT}$ a digital signal resulting from analog-to-digital conversion of the analog input signal at the input node $V_{IN}$.

As illustrated, the circuit 10 comprises a plurality of (two or more) integrator circuits such as 121, 122 cascaded in a signal propagation path from the input node $V_{IN}$ to the quantizer circuit 14 and the first integrator circuit 121 in the cascade has an input coupled to the input node $V_{IN}$ to receive the analog input signal therefrom.

A feedback network 16 is provided which is sensitive to the digital signal at the output node $D_{OUT}$ and comprises a plurality of (two or more) digital-to-analog converters 131, 132 each coupled to a respective integrator circuit 121, 122. The digital-to-analog converters 131, 132 are configured to inject into the input of the respective integrator circuit 121, 122 an analog-converted replica of the digital output signal $D_{OUT}$ weighed via coefficient such as $k_1$, and $k_2$.

As illustrated, the circuit 10 also comprises comparator circuitry 183 configured to receive a comparison signal $D_{AVG}$ which is a function of the digital signal $D_{OUT}$ provided at the output node of the circuit 10. The comparison signal is intended to be compared with a target digital word $D_{TGT}$ and to produce (for instance at an adder node with sign) a difference signal indicative of the result of the comparison.

The circuit 10 is configured (for instance via resistors $R_{GAIN}$ or capacitors $C_{GAIN}$) to be switched to a test mode.

During the test mode, the digital-to-analog converter 131 coupled to the first integrator circuit 121 is configured to receive, in the place of a weighed analog-converted replica of the digital output signal $D_{OUT}$, a periodic alternated digital sequence DS.

During the test mode, the integrator circuit or circuits 122 cascaded to the first integrator circuit 121 is/are reconfigured as a gain stage (see, for instance $G_2$ for the integrator circuit 122) with the digital-to-analog converter (here, 132) coupled therewith disabled.

In that way, inputting into the respective integrator circuit 122 a weighed analog-converted replica of the digital output signal $D_{OUT}$ is discontinued, and the comparator circuitry 18 produces (for instance via a SAR procedure as exemplified at 184) a digital calibration signal $C_{TRIM}$ for (at least one) of the integrator circuits 121, 122 as a function of said difference signal (183).

Advantageously, the digital-to-analog converter $D/A_2$ coupled to the first integrator circuit 121 may be configured to receive a periodic alternated digital sequence DS with a pattern −N, −N, +N, +N, optionally starting after a first single sample of value N/2.

Advantageously, the quantizer circuit 14 is operable at a sampling period $T_S$. The digital-to-analog converter $D/A_1$ coupled to the first integrator circuit 121 may be configured to receive the periodic alternated digital sequence DS with each of the values −N or +N maintained for a time equal to the sampling period $T_S$.

Advantageously, the comparator circuitry 18 may comprise a modulator 181 configured to produce a modulated signal $D_{MOD}$ by modulating the digital signal $D_{OUT}$ provided at the output node with a square-wave signal $F_{MOD}$ as well as a moving average filter 181 supplied with the modulated signal $D_{MOD}$. The moving average filter is configured to produce the comparison signal $D_{AVG}$ for comparison with the target digital word $D_{TGT}$) applying moving average filtering to the modulated signal $D_{MOD}$.

Advantageously, the modulator 181 may be configured to produce the modulated signal $D_{MOD}$ modulating the digital signal $D_{OUT}$ at the output node with a square-wave signal $F_{MOD}$ having a period twice the sampling period $T_S$ of the quantizer circuit 14.

Advantageously, the comparator circuitry 18 may comprise a state machine 184 configured to produce, as a function of the difference signal 183, the digital calibration signal $C_{TRIM}$ to change operating parameters in (at least) the first integrator circuit 121.

Advantageously, a dither source (see, for instance, 141 in FIG. 13) may be provided coupled to the quantizer circuit 14.

Advantageously, the first integrator circuit 121 may comprise a chopped amplifier (see, for instance, $F_{CHOP}$ in FIG. 14).

A device, such as a continuous-time delta-sigma modulator (CTDSM), as illustrated herein may comprise a circuit 10 as discussed previously, wherein the comparator circuitry 18 is integrated to a single integrated device together with the integrator circuits 121, 122, the feedback network 16, 131, 132 and the quantizer circuit 14 to produce (for instance via a SAR procedure as exemplified by the block 184) a digital calibration signal $C_{TRIM}$ for (at least one of) the integrator circuits 121, 122.

A method of operating such a circuit or system may comprise switching the circuit to a test mode as discussed previously.

During such a test mode, the calibration or comparator circuitry 18 produces a digital calibration signal $C_{TRIM}$ for (at least one of) the integrator circuits 121, 122 as a function of the difference signal 183.

Calibration of the integrator circuit(s) may thus be performed as a function of the difference signal.

After calibration, normal operation of the circuit 10 can be restored with all the integrator circuits 121, 122 restored to integrator operation, with the first integrator circuit 121 in the cascade receiving the analog input signal from the input node $V_{IN}$.

With normal operation of the circuit 10 restored, the digital-to-analog converters 131, 132 in the feedback network 16 again inject into the input of the respective integrator circuit 121, 122 an analog-converted replica of the digital output signal $D_{OUT}$ weighed via coefficients like $k_1$ and $k_2$.

Figure 17:
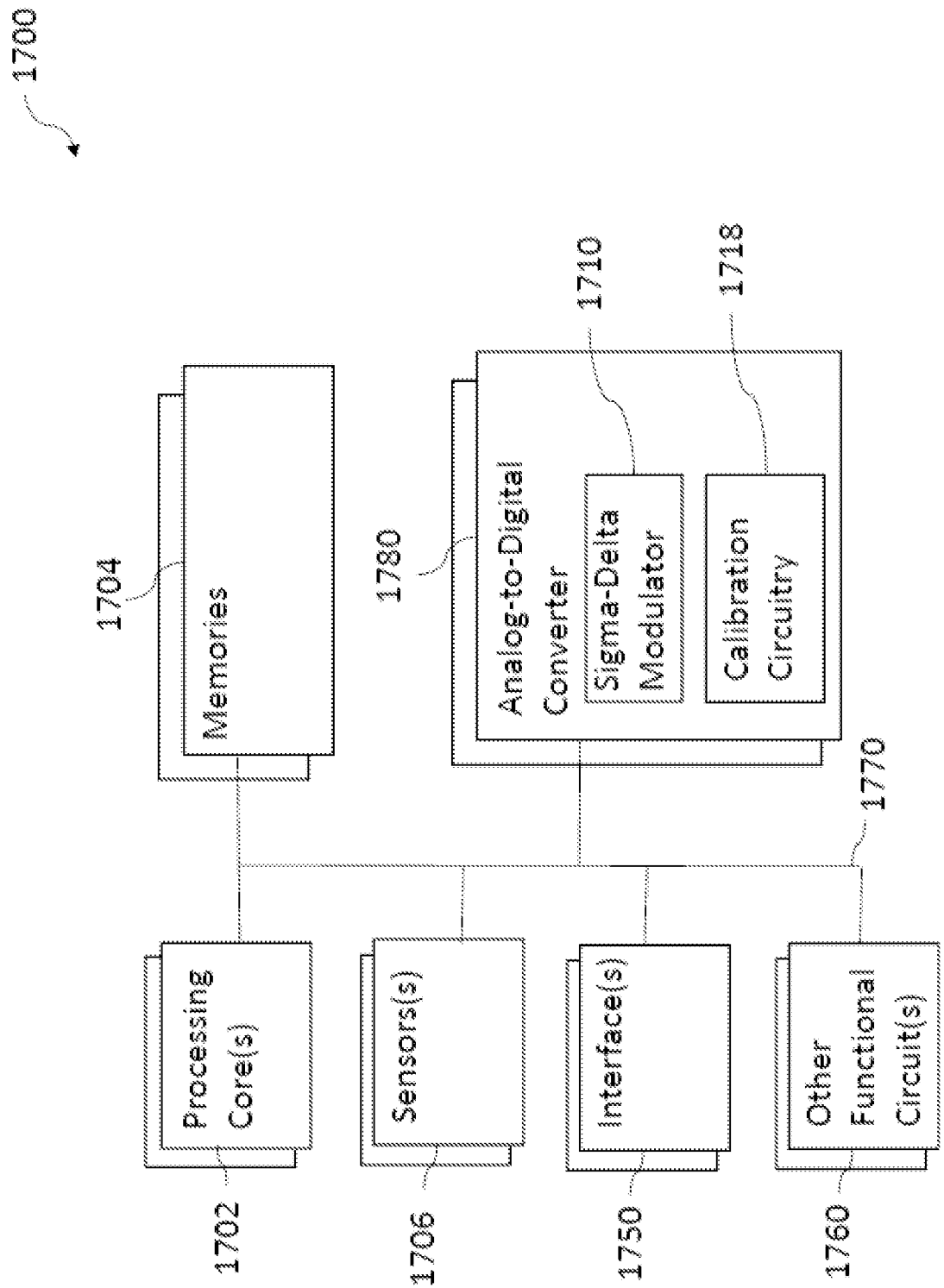
FIG. 17 is a functional block diagram of a system including a delta-sigma converter with calibration according to an embodiment.

FIG. 17 is a functional block diagram of an embodiment of an electronic device or system 1700 of the type to which the described embodiments may apply. The system 1700 comprises one or more processing cores or circuits 1702. The processing cores 1702 may comprise, for example, one or more processors, a state machine, a microprocessor, a programmable logic circuit, discrete circuitry, logic gates, registers, etc., and various combinations thereof. The processing cores 1702 may control overall operation of the system 1700, execution of application programs by the system 1700, etc.

The system 1700 includes one or more memories 1704, such as one or more volatile memories and one or more NVMs, which may store, for example, all or part of instructions and data related to control of the system 1700, applications and operations performed by the system 1700, etc.

The system 1700 may include one or more interfaces 1750 (e.g., wireless communication interfaces, wired communication interfaces, controller interfaces, etc.), and other functional circuits 1760, which may include antennas, power supplies, controllers, motors, etc., and a main bus system 1770. The main bus system 1770 may include one or more data, address, power and/or control buses coupled to the various components of the system 100. The system 100 also may include additional bus systems such as bus system dedicated to coupling one or more of the processors 1702 to one or more of the memories 1704.

The system 1700 includes one or more sensors 1706, such as image sensors, audio sensors, accelerometers, pressure sensors, temperature sensors, encoders or other position sensors, etc., and various combinations thereof, which may provide sensor data for use, for example, by an application executing on the processor, a controller controlling operation of a device (e.g., a motor controller controlling a motor), etc., and various combinations thereof.

As illustrated, the system 1700 includes an analog-to-digital converter 1780, which may be used to convert analog data, such as analog data generated by one or more of the sensors 1706, into digital data, such as digital data samples, which may then be used by various applications of the system. The analog to digital converter as illustrated comprises a sigma-delta modulator 1710 and calibration circuitry 1718. The sigma-delta modulator 10 and calibration circuitry 18 of FIG. 16, for example, may be employed in an embodiment of the analog-to-digital converter 1780 of FIG. 17.

Embodiments of the system 1700 of FIG. 17 may include more components than illustrated, may include fewer components than illustrated, may combine illustrated components or split illustrated components, and various combinations thereof. For example, instead of having a sensor 1706 and a separate analog-to-digital converter 1780, one or more sensor 1706 may be modified to include an analog-to-digital converter 1780. The system 1700 may comprise a system on a chip (SoC), discrete chips coupled together, etc., or various combinations thereof.

The details and embodiments may vary with respect to what has been disclosed herein merely by way of example without departing from the extent of protection.

A circuit (10), may be summarized as including an input node ($V_{IN}$) configured to receive an analog input signal, a quantizer circuit (A/D, 14) having an output node ($D_{OUT}$), the quantizer circuit (A/D, 14) operable to provide at the output node ($D_{OUT}$) a digital signal resulting from analog-to-digital conversion of the analog input signal at the input node ($V_{IN}$), a plurality of integrator circuits (1/s); 121, 122) cascaded in a signal propagation path from the input node ($V_{IN}$) to the quantizer circuit (A/D, 14), the first integrator circuit (121) in the cascade having an input coupled to the input node ($V_{IN}$) to receive the analog input signal therefrom, a feedback network (16) sensitive to the digital signal at the output node ($D_{OUT}$), the feedback network comprising a plurality of digital-to-analog converters (131, 132; D/A$_1$, D/A$_2$) each coupled to a respective integrator circuit (1/s; 121, 122) in the signal propagation path from the input node ($V_{IN}$) to the quantizer circuit (A/D, 14) and configured to inject into the input of the respective integrator circuit (1/s; 121, 122) a weighed ($k_1$, $k_2$) analog-converted replica of said digital output signal ($D_{OUT}$), comparator circuitry (18) configured to receive a comparison signal ($D_{AVG}$) which is a function of the digital signal ($D_{OUT}$) provided at said output node for comparison with a target digital word ($D_{TGT}$) and to produce (183) a difference signal indicative of the result of said comparison, wherein the circuit is configured ($R_{GAIN}$, $C_{GAIN}$) to be switched to a test mode during which: the digital-to-analog converter (131; D/A$_2$) coupled to the first integrator circuit (121) is configured to receive, in the place of a weighed ($k_2$) analog-converted replica of said digital output signal ($D_{OUT}$), a periodic alternated digital sequence (DS), the integrator circuit or circuits (122) cascaded to the first integrator circuit (121) in the signal propagation path from the input node ($V_{IN}$) to the quantizer circuit (A/D, 14) is/are reconfigured ($R_{GAIN}$, $C_{GAIN}$) to a gain stage ($G_2$) with the digital-to-analog converter (132; D/A$_1$) coupled therewith disabled wherein inputting into the respective integrator circuit (1/s; 122) a weighed ($k_1$) analog-converted replica of said digital output signal ($D_{OUT}$) is discontinued, the comparator circuitry (18) produces (184) a digital calibration signal ($C_{TRIM}$) for at least one of the integrator circuits (1/s); 121, 122) cascaded in said signal propagation path from the input node ($V_{IN}$) to the quantizer circuit (A/D, 14) as a function of said difference signal (183).

The digital-to-analog converter (D/A$_1$) coupled to the first integrator circuit (121) may be configured to receive said periodic alternated digital sequence (DS) with a pattern −N, −N, +N, +N, for example, starting after a first single sample of value N/2.

The quantizer circuit (A/D, 14) may be operable at a sampling period ($T_S$) and the digital-to-analog converter (D/A$_1$) coupled to the first integrator circuit (121) may be configured to receive said periodic alternated digital sequence (DS) with each of said values −N or +N maintained for a time equal to said sampling period ($T_S$).

The comparator circuitry (18) may include a modulator (181) configured to produce a modulated signal ($D_{MOD}$) modulating the digital signal ($D_{OUT}$) provided at said output node with a square-wave signal ($F_{MOD}$), and a moving average filter (182) supplied with said modulated signal ($D_{MOD}$) and configured to produce the comparison signal ($D_{AVG}$) for comparison with said target digital word ($D_{TGT}$) applying moving average filtering to the modulated signal ($D_{MOD}$).

The quantizer circuit (A/D, 14) may be operable at a sampling period ($T_S$), and said modulator (181) may be configured to produce said modulated signal ($D_{MOD}$) modulating the digital signal ($D_{OUT}$) provided at said output node with a square-wave signal ($F_{MOD}$) having a period twice said sampling period ($T_S$).

The comparator circuitry (18) may include a state machine (184) configured to produce, as a function of said difference signal (183), said digital calibration signal ($C_{TRIM}$) to change operating parameters in the first integrator circuit (121) in the signal propagation path from the input node ($V_{IN}$) to the quantizer circuit (A/D, 14).

The circuit may include a dither source (141) coupled to the quantizer circuit (A/D, 14) operable to provide said digital signal at said output node ($D_{OUT}$).

The first integrator circuit (121) in the signal propagation path from the input node ($V_{IN}$) to the quantizer circuit (A/D, 14) may include a chopped amplifier ($F_{CHOP}$).

Said comparator circuitry (18) may be integrated to a single integrated device with said plurality of integrator circuits (1/s); 121, 122), said feedback network (16, 131, 132) and quantizer circuit (A/D, 14) to produce (184) said digital calibration signal ($C_{TRIM}$) for at least one of the integrator circuits (1/s); 121, 122) cascaded in said signal propagation path from the input node ($V_{IN}$) to the quantizer circuit (A/D, 14).

A method of operating a circuit or a device may be summarized as including switching said circuit (10) to said test mode wherein the comparator circuitry (18) produces (184) said digital calibration signal ($C_{TRIM}$) for at least one of the integrator circuits (1/s); 121, 122) cascaded in said signal propagation path from the input node ($V_{IN}$) to the quantizer circuit (A/D, 14) as a function of said difference signal (183), performing calibration of said at least one of the integrator circuits (1/s); 121, 122) cascaded in said signal propagation path from the input node ($V_{IN}$) to the quantizer circuit (A/D, 14) as a function of said difference signal (183), and restoring, after calibration, operation of said circuit (10) wherein, during operation: all the integrator circuits (1/s); 121, 122) cascaded in said signal propagation path from the input node ($V_{IN}$) to the quantizer circuit (A/D, 14) are restored to integrator operation, with the first integrator circuit (121) in the cascade receiving said analog input signal at said input node ($V_{IN}$), and the plurality of digital-to-analog converters (131, 132; $D/A_1$, $D/A_2$) in the feedback network (16) inject into the input of the respective integrator circuit (1/s; 121, 122) a weighed ($k_1$, $k_2$) analog-converted replica of said digital output signal ($D_{OUT}$).

In an embodiment, a device comprises a delta-sigma modulator having: an input node; a quantizer; a signal propagation path including a plurality of cascaded integrators coupled between the input node and the quantizer; and a feedback network including a plurality of digital-to-analog converters. In a quantizing mode of operation, each of the plurality of digital-to-analog converters of the feedback network is coupled between an output of the quantizer and a respective integrator of the plurality of cascaded integrators; and the delta-sigma modulator generates a digital signal at an output of the quantizer based on an analog input signal received at the input node. In a calibration mode of operation, calibration circuitry is coupled to the output of the quantizer. A first digital-to-analog converter of the plurality of digital-to-analog converters of the feedback network receives a signal including a periodic alternated digital sequence, the first digital-to-analog converter being coupled to a first integrator of the plurality of cascaded integrators. Integrators of the plurality of cascaded integrators other than the first integrator operate in a gain mode of operation. The delta-sigma modulator generates a digital test signal at an output of the quantizer based on the signal including the periodic alternated digital sequence, and the calibration circuitry generates an integrator calibration signal based on the digital test signal and a reference digital word.

In an embodiment, the signal propagation path comprises: a first adder having: a first input coupled to the input node; a second input coupled to an output of the first digital-to-analog converter; and an output coupled to an input of the first integrator; and a second adder having: a first input coupled to an output of the first integrator; and an output coupled to an input of a second integrator of the plurality of cascaded integrators, wherein in the quantizing mode of operation, a second input of the second adder is coupled to an output of a second digital-to-analog converter of the plurality of digital-to-analog converters of the feedback network. In an embodiment, in the calibration mode of operation, operation of the second digital-to-analog converter is disabled.

In an embodiment, in the quantization mode of operation, the digital-to-analog converters of the feedback network generate respective weighted analog replicas of the output of the quantizer. In an embodiment, the periodic alternated digital sequence is a pattern having a form –N, –N, +N, +N, where N is a defined digital value. In an embodiment, the signal including the periodic alternated digital sequence comprises a value N/2 followed by the periodic alternating digital sequence. In an embodiment the quantizer has a sampling period and the periodic alternated digital sequence maintains the values –N or +N for a time equal to the sampling period.

In an embodiment, the calibration circuitry comprises: a modulator, which, in the calibration mode of operation, modulates the output of the quantizer with a square-wave signal, generating a modulated signal; a moving average filter, which, in the calibration mode of operation, generates an average signal based on the modulated signal; and a comparator, which in the calibration mode of operation, compares the average signal with a reference digital word, generating a difference signal. In an embodiment, in the calibration mode of operation: the quantizer has a sampling period, and the square-wave signal has a period of twice the sampling period. In an embodiment, the calibration circuitry comprises a state machine, which, in the calibration mode of operation, generates the integrator calibration signal as a function of the difference signal. In an embodiment, the device comprises a dither circuit coupled to an input of the signal propagation path, wherein the dither circuit, in the calibration mode of operation, generates a dither signal. In an embodiment, the signal propagation path comprises a chopping amplifier coupled to an input of the first integrator of the plurality of cascaded integrators. In an embodiment, in the calibration mode of operation, trim values of the plurality of integrators are set based on the integrator calibration signal. In an embodiment, the device comprises an integrated circuit including the delta-sigma modulator and the calibration circuitry.

In an embodiment, a system comprises: a sensor; a delta-sigma modulator coupled to the sensor, the delta-sigma modulator having: a quantizer; a signal propagation path including a plurality of cascaded integrators coupled between the sensor and the quantizer; and a feedback network including a plurality of digital-to-analog converters, wherein in a quantizing mode of operation, each of the plurality of digital-to-analog converters of the feedback network is coupled between an output of the quantizer and a respective integrator of the plurality of cascaded integrators; and the delta-sigma modulator generates a digital signal at an output of the quantizer based on an analog input signal received from the sensor; and calibration circuitry coupled to the output of the quantizer, wherein in a calibration mode of operation, a first digital-to-analog converter of the plurality of digital-to-analog converters of the feedback network receives a signal including a periodic alternated digital sequence, the first digital-to-analog converter being coupled to a first integrator of the plurality of cascaded integrators; integrators of the plurality of cascaded integrators other than the first integrator operate in a gain mode of operation; the delta-sigma modulator generates a digital test signal at an output of the quantizer based on the signal including the periodic alternated digital sequence; and the calibration circuitry generates an integrator calibration signal based on the digital test signal and a reference digital word. In an embodiment, the periodic alternated digital sequence is a pattern having a form −N, −N, +N, +N, where N is a defined digital value. In an embodiment, the signal including the periodic alternated digital sequence comprises a value N/2 followed by the periodic alternating digital sequence. In an embodiment, the calibration circuitry comprises: a modulator, which, in the calibration mode of operation, modulates the output of the quantizer with a square-wave signal, generating a modulated signal; a moving average filter, which, in the calibration mode of operation, generates an average signal based on the modulated signal; and a comparator, which in the calibration mode of operation, compares the average signal with a reference digital word, generating a difference signal. In an embodiment, in the calibration mode of operation: the quantizer has a sampling period, and the square-wave signal has a period of twice the sampling period. In an embodiment, the calibration circuitry comprises a state machine, which, in a calibration mode of operation, generates the integrator calibration signal as a function of the difference signal.

In an embodiment, a method comprises: operating a delta-sigma modulator having calibration circuitry in a calibration mode of operation, generating an integrator calibration signal; calibrating the delta-sigma modulator based on the integrator calibration signal; and operating the calibrated delta-sigma modulator in a quantizing mode of operation, wherein, the delta-sigma modulator includes: an input node; a quantizer; a signal propagation path including a plurality of cascaded integrators coupled between the input node and the quantizer; and a feedback network including a plurality of digital-to-analog converters, in the calibration mode of operation, the calibration circuitry is coupled to the output of the quantizer; a first digital-to-analog converter of the plurality of digital-to-analog converters of the feedback network receives a signal including a periodic alternated digital sequence, the first digital-to-analog converter being coupled to a first integrator of the plurality of cascaded integrators; integrators of the plurality of cascaded integrators other than the first integrator operate in a gain mode of operation; the delta-sigma modulator generates a digital test signal at an output of the quantizer based on the signal including the periodic alternated digital sequence; and the calibration circuitry generates the integrator calibration signal based on the digital test signal and a reference digital word, and in the quantizing mode of operation, each of the plurality of digital-to-analog converters of the feedback network is coupled between an output of the quantizer and a respective integrator of the plurality of cascaded integrators; and the delta-sigma modulator generates a digital signal at an output of the quantizer based on an analog input signal received at the input node. In an embodiment, the periodic alternated digital sequence is a pattern having a form −N, −N, +N, +N, where N is a defined digital value. In an embodiment, the signal including the periodic alternated digital sequence comprises a value N/2 followed by the periodic alternating digital sequence. In an embodiment, the calibration circuitry comprises: a modulator, which, in the calibration mode of operation, modulates the output of the quantizer with a square-wave signal, generating a modulated signal; a moving average filter, which, in the calibration mode of operation, generates an average signal based on the modulated signal; and a comparator, which in the calibration mode of operation, compares the average signal with a reference digital word, generating a difference signal.

In an embodiment, a non-transitory computer-readable medium's contents configure a delta-sigma modulator having calibration circuitry to perform a method, the method comprising: operating the delta-sigma modulator in a calibration mode of operation, generating an integrator calibration signal; calibrating the delta-sigma modulator based on the integrator calibration signal; and operating the calibrated delta-sigma modulator in a quantizing mode of operation, wherein, the delta-sigma modulator includes: an input node; a quantizer; a signal propagation path including a plurality of cascaded integrators coupled between the input node and the quantizer; and a feedback network including a plurality of digital-to-analog converters, in the calibration mode of operation, the calibration circuitry is coupled to the output of the quantizer; a first digital-to-analog converter of the plurality of digital-to-analog converters of the feedback network receives a signal including a periodic alternated digital sequence, the first digital-to-analog converter being coupled to a first integrator of the plurality of cascaded integrators; integrators of the plurality of cascaded integrators other than the first integrator operate in a gain mode of operation; the delta-sigma modulator generates a digital test signal at an output of the quantizer based on the signal including the periodic alternated digital sequence; and the calibration circuitry generates the integrator calibration signal based on the digital test signal and a reference digital word, and in the quantizing mode of operation, each of the plurality of digital-to-analog converters of the feedback network is coupled between an output of the quantizer and a respective integrator of the plurality of cascaded integrators; and the delta-sigma modulator generates a digital signal at an output of the quantizer based on an analog input signal received at the input node. In an embodiment, the periodic alternated digital sequence is a pattern having a form −N, −N, +N, +N, where N is a defined digital value. In an embodiment, the contents comprise instructions executed by a processing device of the delta-sigma modulator.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A device, comprising:
a delta-sigma modulator having:
an input node;
a quantizer;
a signal propagation path including a plurality of cascaded integrators coupled between the input node and the quantizer; and
a feedback network including a plurality of digital-to-analog converters, wherein in a quantizing mode of operation,
each of the plurality of digital-to-analog converters of the feedback network is coupled between an output of the quantizer and a respective integrator of the plurality of cascaded integrators; and
the delta-sigma modulator generates a digital signal at an output of the quantizer based on an analog input signal received at the input node; and
calibration circuitry coupled to the output of the quantizer, wherein in a calibration mode of operation,
a first digital-to-analog converter of the plurality of digital-to-analog converters of the feedback network receives a signal including a periodic alternated digital sequence, the first digital-to-analog converter being coupled to a first integrator of the plurality of cascaded integrators;
integrators of the plurality of cascaded integrators other than the first integrator operate in a gain mode of operation;
the delta-sigma modulator generates a digital test signal at an output of the quantizer based on the signal including the periodic alternated digital sequence; and
the calibration circuitry generates an integrator calibration signal based on the digital test signal and a reference digital word.

2. The device of claim 1, wherein the signal propagation path comprises:
a first adder having:
a first input coupled to the input node;
a second input coupled to an output of the first digital-to-analog converter; and
an output coupled to an input of the first integrator; and
a second adder having:
a first input coupled to an output of the first integrator; and
an output coupled to an input of a second integrator of the plurality of cascaded integrators, wherein in the quantizing mode of operation, a second input of the second adder is coupled to an output of a second digital-to-analog converter of the plurality of digital-to-analog converters of the feedback network.

3. The device of claim 2, wherein, in the calibration mode of operation, operation of the second digital-to-analog converter is disabled.

4. The device of claim 1, wherein, in the quantization mode of operation, the digital-to-analog converters of the feedback network generate respective weighted analog replicas of the output of the quantizer.

5. The device of claim 1, wherein the periodic alternated digital sequence is a pattern having a form −N, −N, +N, +N, where N is a defined digital value.

6. The device of claim 5, wherein the signal including the periodic alternated digital sequence comprises a value N/2 followed by the periodic alternating digital sequence.

7. The device of claim 5, wherein the quantizer has a sampling period and the periodic alternated digital sequence maintains the values −N or +N for a time equal to the sampling period.

8. The device of claim 1, wherein the calibration circuitry comprises:
a modulator, which, in the calibration mode of operation, modulates the output of the quantizer with a square-wave signal, generating a modulated signal;
a moving average filter, which, in the calibration mode of operation, generates an average signal based on the modulated signal; and
a comparator, which in the calibration mode of operation, compares the average signal with a reference digital word, generating a difference signal.

9. The device of claim 8, wherein, in the calibration mode of operation:
the quantizer has a sampling period, and
the square-wave signal has a period of twice the sampling period.

10. The device of claim 8, wherein the calibration circuitry comprises a state machine, which, in the calibration mode of operation, generates the integrator calibration signal as a function of the difference signal.

11. The device of claim 1, comprising a dither circuit coupled to an input of the signal propagation path, wherein the dither circuit, in the calibration mode of operation, generates a dither signal.

12. The device of claim 1, wherein the signal propagation path comprises a chopping amplifier coupled to an input of the first integrator of the plurality of cascaded integrators.

13. The device of claim 1, wherein, in the calibration mode of operation, trim values of the plurality of integrators are set based on the integrator calibration signal.

14. The device of claim 1, comprising an integrated circuit including the delta-sigma modulator and the calibration circuitry.

15. A system, comprising:
a sensor;
a delta-sigma modulator coupled to the sensor, the delta-sigma modulator having:
a quantizer;
a signal propagation path including a plurality of cascaded integrators coupled between the sensor and the quantizer; and
a feedback network including a plurality of digital-to-analog converters, wherein in a quantizing mode of operation,
each of the plurality of digital-to-analog converters of the feedback network is coupled between an output of the quantizer and a respective integrator of the plurality of cascaded integrators; and
the delta-sigma modulator generates a digital signal at an output of the quantizer based on an analog input signal received from the sensor; and
calibration circuitry coupled to the output of the quantizer, wherein in a calibration mode of operation,
a first digital-to-analog converter of the plurality of digital-to-analog converters of the feedback network receives a signal including a periodic alternated digital sequence, the first digital-to-analog converter being coupled to a first integrator of the plurality of cascaded integrators;

integrators of the plurality of cascaded integrators other than the first integrator operate in a gain mode of operation;

the delta-sigma modulator generates a digital test signal at an output of the quantizer based on the signal including the periodic alternated digital sequence; and the calibration circuitry generates an integrator calibration signal based on the digital test signal and a reference digital word.

16. The system of claim 15, wherein the periodic alternated digital sequence is a pattern having a form −N, −N, +N, +N, where N is a defined digital value.

17. The system of claim 16, wherein the signal including the periodic alternated digital sequence comprises a value N/2 followed by the periodic alternating digital sequence.

18. The system of claim 15, wherein the calibration circuitry comprises:

a modulator, which, in the calibration mode of operation, modulates the output of the quantizer with a square-wave signal, generating a modulated signal;

a moving average filter, which, in the calibration mode of operation, generates an average signal based on the modulated signal; and a comparator, which in the calibration mode of operation, compares the average signal with a reference digital word, generating a difference signal.

19. The system of claim 18, wherein, in the calibration mode of operation:

the quantizer has a sampling period, and the square-wave signal has a period of twice the sampling period.

20. The system of claim 18, wherein the calibration circuitry comprises a state machine, which, in a calibration mode of operation, generates the integrator calibration signal as a function of the difference signal.

21. A method, comprising:

operating a delta-sigma modulator having calibration circuitry in a calibration mode of operation, generating an integrator calibration signal;

calibrating the delta-sigma modulator based on the integrator calibration signal; and operating the calibrated delta-sigma modulator in a quantizing mode of operation, wherein, the delta-sigma modulator includes:
an input node;
a quantizer;
a signal propagation path including a plurality of cascaded integrators coupled between the input node and the quantizer; and
a feedback network including a plurality of digital-to-analog converters, in the calibration mode of operation,
the calibration circuitry is coupled to an output of the quantizer;
a first digital-to-analog converter of the plurality of digital-to-analog converters of the feedback network receives a signal including a periodic alternated digital sequence, the first digital-to-analog converter being coupled to a first integrator of the plurality of cascaded integrators;
integrators of the plurality of cascaded integrators other than the first integrator operate in a gain mode of operation;

the delta-sigma modulator generates a digital test signal at an output of the quantizer based on the signal including the periodic alternated digital sequence; and the calibration circuitry generates the integrator calibration signal based on the digital test signal and a reference digital word, and in the quantizing mode of operation,
each of the plurality of digital-to-analog converters of the feedback network is coupled between an output of the quantizer and a respective integrator of the plurality of cascaded integrators; and
the delta-sigma modulator generates a digital signal at an output of the quantizer based on an analog input signal received at the input node.

22. The method of claim 21, wherein the periodic alternated digital sequence is a pattern having a form −N, −N, +N, +N, where N is a defined digital value.

23. The method of claim 22, wherein the signal including the periodic alternated digital sequence comprises a value N/2 followed by the periodic alternating digital sequence.

24. The method of claim 21, wherein the calibration circuitry comprises:

a modulator, which, in the calibration mode of operation, modulates the output of the quantizer with a square-wave signal, generating a modulated signal;

a moving average filter, which, in the calibration mode of operation, generates an average signal based on the modulated signal; and a comparator, which in the calibration mode of operation, compares the average signal with a reference digital word, generating a difference signal.

25. A non-transitory computer-readable medium having contents which configure a delta-sigma modulator having calibration circuitry to perform a method, the method comprising:

operating the delta-sigma modulator in a calibration mode of operation, generating an integrator calibration signal;

calibrating the delta-sigma modulator based on the integrator calibration signal; and operating the calibrated delta-sigma modulator in a quantizing mode of operation, wherein, the delta-sigma modulator includes:
an input node;
a quantizer;
a signal propagation path including a plurality of cascaded integrators coupled between the input node and the quantizer; and
a feedback network including a plurality of digital-to-analog converters, in the calibration mode of operation,
the calibration circuitry is coupled to an output of the quantizer;
a first digital-to-analog converter of the plurality of digital-to-analog converters of the feedback network receives a signal including a periodic alternated digital sequence, the first digital-to-analog converter being coupled to a first integrator of the plurality of cascaded integrators;
integrators of the plurality of cascaded integrators other than the first integrator operate in a gain mode of operation;
the delta-sigma modulator generates a digital test signal at an output of the quantizer based on the signal including the periodic alternated digital sequence; and the calibration circuitry generates the integrator calibration signal based on the digital test signal and a reference digital word, and in the quantizing mode of operation, each of the plurality of digital-to-analog converters of the feedback network is coupled between an output of the quantizer and a respective integrator of the plurality of cascaded integrators; and the delta-sigma modulator generates a digital signal at an output of the quantizer based on an analog input signal received at the input node.

26. The non-transitory computer-readable medium of claim 25, wherein the periodic alternated digital sequence is a pattern having a form −N, −N, +N, +N, where N is a defined digital value.

27. The non-transitory computer-readable medium of claim 25, wherein the contents comprise instructions executed by a processing device of the delta-sigma modulator.

* * * * *